(12) United States Patent
Aoki

(10) Patent No.: US 11,258,975 B2
(45) Date of Patent: Feb. 22, 2022

(54) SOLID-STATE IMAGING DEVICE AND ELECTRONIC DEVICE

(71) Applicant: SONY SEMICONDUCTOR SOLUTIONS CORPORATION, Kanagawa (JP)

(72) Inventor: Takeshi Aoki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/253,990

(22) PCT Filed: Jun. 7, 2019

(86) PCT No.: PCT/JP2019/022832
§ 371 (c)(1),
(2) Date: Dec. 18, 2020

(87) PCT Pub. No.: WO2020/003980
PCT Pub. Date: Jan. 2, 2020

(65) Prior Publication Data
US 2021/0274122 A1    Sep. 2, 2021

(30) Foreign Application Priority Data

Jun. 28, 2018 (JP) .............................. JP2018-122820

(51) Int. Cl.
*H04N 5/3745* (2011.01)
*H03K 5/24* (2006.01)
(Continued)

(52) U.S. Cl.
CPC ... *H04N 5/37455* (2013.01); *H01L 27/14612* (2013.01); *H01L 27/14643* (2013.01);
(Continued)

(58) Field of Classification Search
CPC ........... H04N 5/37455; H04N 5/37457; H04N 5/3765; H04N 5/378; H04N 5/374;
(Continued)

(56) References Cited

U.S. PATENT DOCUMENTS 6,229,346 B1 *  5/2001  Milanese ............. H03K 3/3565
                                                           327/65
6,864,725 B2 *  3/2005  Cowles .......... H03K 19/018528
                                                           327/108
(Continued)

FOREIGN PATENT DOCUMENTS

JP    2005-323331 A    11/2005
JP    2011-109612 A     6/2011
(Continued)

OTHER PUBLICATIONS

International Search Report and Written Opinion of PCT Application No. PCT/JP2019/022832, dated Aug. 27, 2019, 07 pages of ISRWO.

*Primary Examiner* — Abdelaaziz Tissire
(74) *Attorney, Agent, or Firm* — Chip Law Group

(57) ABSTRACT

A solid-state imaging device that is capable of improving an imaging characteristic by enhancing a dynamic range of an ADC is provided. A solid-state imaging device that includes a pixel array including a plurality of pixels outputting a pixel signal by photoelectric conversion, and an AD conversion processing unit that performs AD conversion with respect to the pixel signal, and in which the AD conversion processing unit includes a comparator having a first amplifying unit that includes a pair of first differential pairs constituted of P-type transistors and a pair of second differential pairs constituted of N-type transistors, and a second amplifying unit that amplifies an output of the first amplifying unit, and in which a P-type transistor and an N-type transistor are connected in series is provided.

10 Claims, 17 Drawing Sheets

(51) Int. Cl.
*H04N 5/376* (2011.01)
*H04N 5/378* (2011.01)
*H01L 27/146* (2006.01)

(52) U.S. Cl.
CPC ........... *H03K 5/2481* (2013.01); *H04N 5/378* (2013.01); *H04N 5/3765* (2013.01); *H04N 5/37457* (2013.01)

(58) Field of Classification Search
CPC .. H04N 5/355; H04N 5/357; H01L 27/14612; H01L 27/14643; H01L 27/14645; H03M 1/181; H03M 1/0607; H03M 1/123; H03M 1/56; H03K 5/2481; H03K 5/08
See application file for complete search history.

(56) References Cited

U.S. PATENT DOCUMENTS

| | | | | |
|---|---|---|---|---|
| 2002/0021606 A1* | 2/2002 | Tsuchi | | G09G 3/3688 365/203 |
| 2002/0109532 A1* | 8/2002 | Nakada | | H03K 5/2481 327/74 |
| 2003/0001666 A1* | 1/2003 | Watanabe | | H03K 5/19 327/563 |
| 2005/0239433 A1* | 10/2005 | Klein | | G11C 7/1084 455/343.2 |
| 2006/0214700 A1* | 9/2006 | Nairn | | H03K 5/2481 327/77 |
| 2008/0042689 A1* | 2/2008 | Yen | | H03K 5/2481 326/82 |
| 2008/0144398 A1* | 6/2008 | Blodgett | | G11C 7/1078 365/189.05 |
| 2010/0289531 A1* | 11/2010 | Sudjian | | H03K 3/3565 327/65 |
| 2013/0181776 A1* | 7/2013 | Lo | | H03F 3/45219 330/253 |
| 2014/0291482 A1 | 10/2014 | Tanaka et al. | | |
| 2015/0138414 A1 | 5/2015 | Sakakibara et al. | | |
| 2016/0309100 A1* | 10/2016 | Abe | | H01L 27/14636 |
| 2017/0272678 A1 | 9/2017 | Sakakibara et al. | | |
| 2018/0109744 A1 | 4/2018 | Hanzawa et al. | | |

FOREIGN PATENT DOCUMENTS

| | | |
|---|---|---|
| JP | 2011-229120 A | 11/2011 |
| JP | 2014-023065 A | 2/2014 |
| JP | 2014-197773 A | 10/2014 |
| WO | 2016/009832 A1 | 1/2016 |
| WO | 2016/163228 A1 | 10/2016 |

* cited by examiner

SOLID-STATE IMAGING DEVICE AND ELECTRONIC DEVICE

CROSS REFERENCE TO RELATED APPLICATIONS

This application is a U.S. National Phase of International Patent Application No. PCT/JP2019/022832 filed on Jun. 7, 2019, which claims priority benefit of Japanese Patent Application No. JP 2018-122820 filed in the Japan Patent Office on Jun. 28, 2018. Each of the above-referenced applications is hereby incorporated herein by reference in its entirety.

FIELD

The present disclosure relates to a solid-state imaging device and an electronic device.

BACKGROUND

As solid-state imaging apparatuses to capture an image, for example, a charge coupled device (CCD) image sensor and a complementary metal oxide semiconductor (CMOS) image sensor have been developed, and the CMOS image sensor has been receiving attention because of the demands for miniaturization and the like.

The CMOS image sensor has an AD converting unit that AD (analog to digital) converts an analog electrical signal output by a pixel that performs photoelectric conversion. As the AD converting unit of the CMOS image sensor, to respond to the demand for increased processing speed and the like, a column-parallel type AD converting unit (hereinafter, referred to as column-parallel AD converting unit also) that is capable of parallelly AD converting electrical signals output by two or more pixels, such as all of plural pixels aligned in a row is adopted (Patent Literature 1).

The column-parallel AD converting unit is constructed, for example, by arranging plural ADCs (AD converters) in the same number as the number of columns of pixels aligned in a direction of columns, and the ADCs of each column perform AD conversion of an electrical signal output by a pixel of the column.

As the ADC constituting the column-parallel AD converting unit, for example, so to speak, a reference-signal comparison type ADC that includes a comparator and a counter, and that performs AD conversion of an electrical signal by comparing a predetermined reference signal and an electrical signal output by a pixel is available (Patent Literature 2).

CITATION LIST

Patent Literature

Patent Literature 1: JP-A-2005-323331
Patent Literature 2: JP-A-2014-23065

SUMMARY

Technical Problem

Application of the CMOS image sensor to surveillance cameras and biometric authentication devices has been increasing. For such a use, the CMOS image sensor is demanded to have a high dynamic range, and characteristics at imaging at a low light condition are to be an important indicator. There is a method of achieving a high sensitivity by using an analog gain and a digital gain in combination, but it is preferable to obtain a high gain with an analog circuit in terms of characteristics.

Accordingly, the present disclosure proposes novel and improved solid-state imaging device and electronic device that enable to improve the imaging characteristics by enhancing a dynamic range of an ADC.

Solution to Problem

According to the present disclosure, a solid-state imaging device is provided that includes: a pixel array that includes a plurality of pixels outputting a pixel signal by photoelectric conversion; and an AD conversion processing unit that performs AD conversion with respect to the pixel signal, wherein the AD conversion processing unit includes a comparator including a first amplifying unit that includes a pair of first differential pairs constituted of P-type transistors and a pair of second differential pairs constituted of N-type transistors; and a second amplifying unit that amplifies an output of the first amplifying unit, and in which a P-type transistor and an N-type transistor are connected in series.

Moreover, according to the present disclosure, an electronic device is provided that includes: a solid-state imaging device; and a processing unit that processes a signal output from the solid-state imaging device, wherein the solid-state imaging device includes a pixel array that includes a plurality of pixels outputting a pixel signal by photoelectric conversion; and an AD conversion processing unit that performs AD conversion with respect to the pixel signal, wherein the AD conversion processing unit includes a comparator including a first amplifying unit that includes a pair of first differential pairs constituted of P-type transistors and a pair of second differential pairs constituted of N-type transistors; and a second amplifying unit that amplifies an output of the first amplifying unit, and in which a P-type transistor and an N-type transistor are connected in series.

Advantageous Effects of Invention

According to the present disclosure, novel and improved solid-state imaging device and electronic device that enable to improve the imaging characteristics by enhancing a dynamic range of an ADC can be provided.

The effect described above is not necessarily limited, and either effect described in the present application, or other effects that can be understood from the present application may be produced in addition to the effect described above or in place of the effect described above.

DESCRIPTION OF EMBODIMENTS

Hereinafter, exemplary embodiments of the present disclosure will be explained in detail with reference to the accompanying drawings. In the present application and the drawings, identical reference signs are assigned to components having substantially the same functional configurations, and duplicated explanation will be thereby omitted.

Explanation will be given in following order.
1. Embodiment of Present Disclosure
   1.1. Background
   1.2. Configuration Example and Operation Example
2. Example of Application to Electronic Device
3. Example of Application to Mobile Object
4. Conclusion
   <1. Embodiment of Present Disclosure>
[1.1 Background]

First, the background that led to an embodiment of the present disclosure will be explained.

As described above, the CMOS image sensor has an AD converting unit that AD converts an analog electrical signal output by a pixel performing photoelectric conversion, and as the AD converting unit, a column-parallel AD converting unit that is capable of AD converting electrical signals output by two or more pixels in parallel is adopted. The column-parallel AD converting unit is constructed by arranging plural ADCs prepared in the same number as the number of columns of pixels or the like in a direction of row, and each ADC perform AD conversion of electrical signals output by pixels in the column.

Application of the CMOS image sensor to surveillance cameras and biometric authentication devices has been increasing. For such a use, the CMOS image sensor is demanded to have a high dynamic range, and characteristics at imaging at a low light condition are to be an important indicator. There is a method of achieving a high sensitivity by using an analog gain and a digital gain in combination, but it is preferable to obtain a high gain with an analog circuit in terms of characteristics because digital processing causes deterioration in characteristics.

As for characteristics of pixels also, with an increase of FWC (full well capacity), a dynamic range of illuminance increases. However, the dynamic range is determined by an input of the ADC, or an operation margin of the CDS (correlated double sampling) decreases at a high gain.

Figure 1:
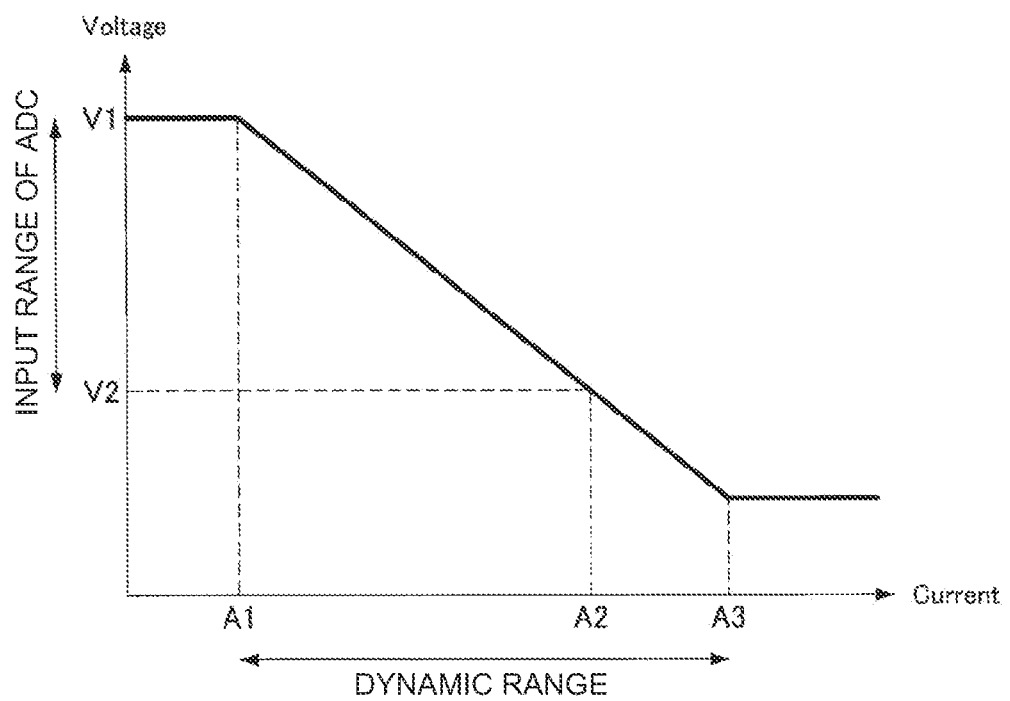
FIG. 1 is an explanatory diagram illustrating an example of relationship between a dynamic range of an electric current output from a pixel and a dynamic range of an ADC.

FIG. 1 is an explanatory diagram illustrating an example of relationship between a dynamic range of an electric current output from a pixel and a dynamic range of the ADC. In FIG. 1, a dynamic range on a pixel side is indicated by an electric current, and a dynamic range of the ADC is indicated by a voltage. The dynamic range of the ADC is supposed to be V1 to V2. Suppose that a current value of a pixel corresponding to V1 (current value of an electric current flown by a photodiode) is A1, and a current value of a pixel corresponding to V2 is A2. Even if the dynamic range of the pixel is A1 to A3, because a lower limit of the dynamic range of the ADC is V2, the dynamic range of the pixel is to be limited to A1 to A2. Therefore, if the dynamic range of the pixel is expanded, the dynamic range of the ADC is needed to be expanded also (that is, to reach a voltage lower than V2 indicated in FIG. 1).

Figure 2:
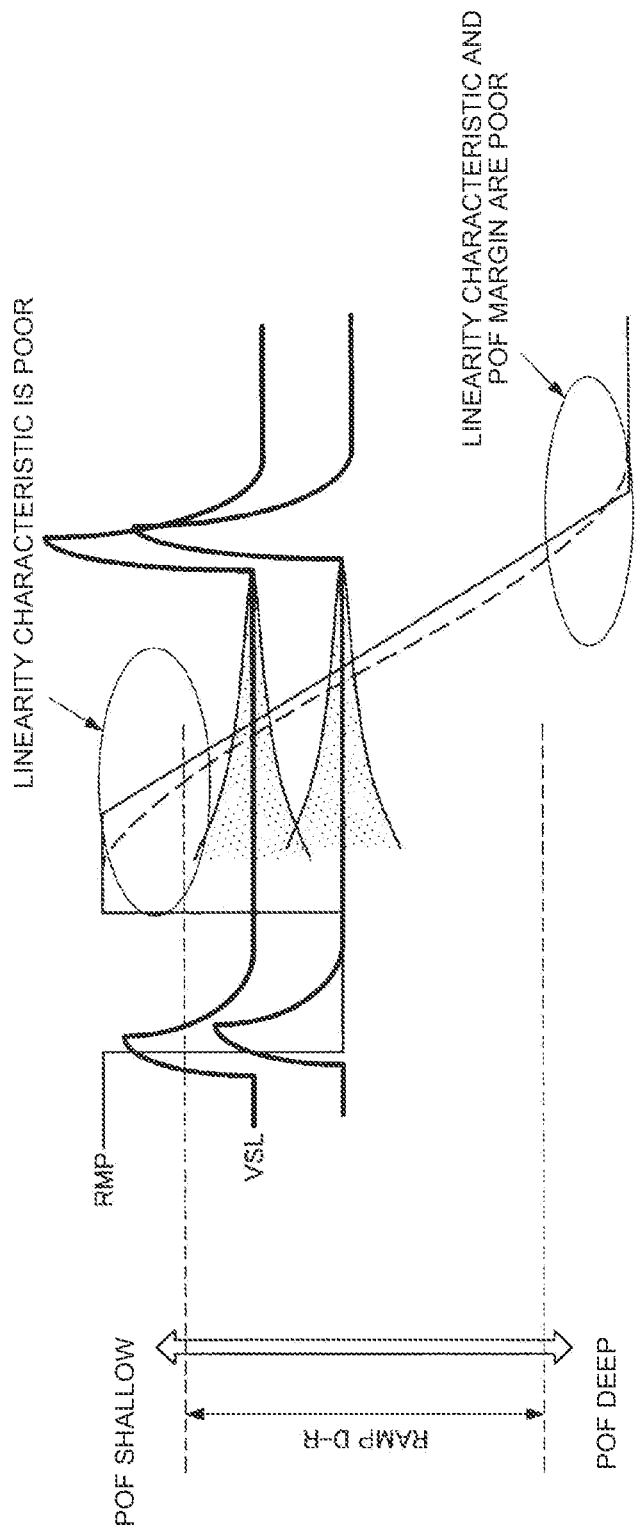
FIG. 2 is an explanatory diagram illustrating a state in which an operation margin of a CDS decreases at a high gain according to the embodiment.

FIG. 2 is an explanatory diagram illustrating a state in which an operation margin of a CDS decreases at a high gain. In FIG. 2, an output VSL from a pixel and a waveform of a ramp signal input to the comparator of the ADC are indicated. In the waveform of a ramp signal input to the comparator, a region excellent in linearity itself decreases at a high gain. For this, if a voltage range (P-phase margin) of the ramp signal that can be used for A/D conversion of a P phase is intended to be reserved by reducing a P-phase offset, the linearity of the ramp signal is deteriorated.

In the future, pixels and analog circuits are expected to further shift toward lower voltages, and it is necessary to reserve an operation margin of ADCs. Therefore, in view of the points described above, the present disclosers have earnestly studied about a technique capable of expanding a dynamic range of an ADC that is used in the CMOS image sensor. As a result, the present disclosers have invented a technique that enables to expand a dynamic range of an ADC used in the CMOS image sensors as explained below.

As above, the background of the embodiment of the present disclosure has been explained. Subsequently, the embodiment of the present disclosure will be explained in detail.

[1.2. Configuration Example and Operation Example]

Figure 3:
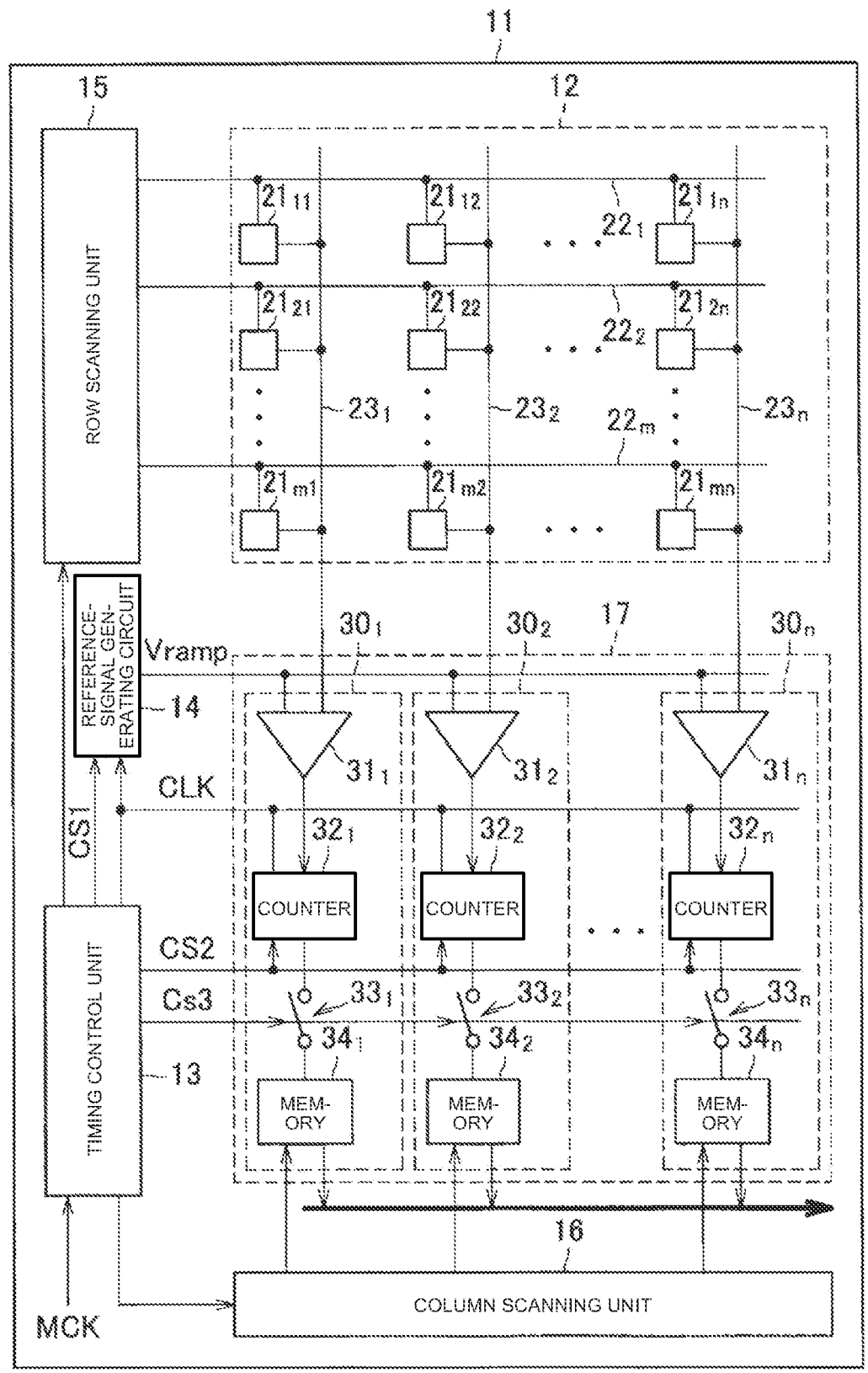
FIG. 3 is a block diagram for explaining a configuration example of a solid-state imaging device according to an embodiment of the present disclosure.

Next, a configuration example of a solid-state imaging device according to the embodiment of the present disclosure will be explained with reference to FIG. 3. FIG. 3 is a block diagram illustrating a configuration example of an embodiment of the solid-state imaging device to which the present technique is applied.

As illustrated in FIG. 3, a solid-state imaging device 11 is a CMOS image sensor, and includes a pixel array unit 12, a timing control unit 13, a reference-signal generating circuit 14, a row scanning unit 15, a column scanning unit 16, and a column processing unit 17.

In the pixel array unit 12, plural pixels 21 are arranged in a matrix. In the example in FIG. 3, m rows×n columns pixels $21_{11}$ to $21_{mn}$ are arranged in a matrix, and the pixels 21 of each row are connected to the row scanning unit 15 through m pieces of horizontal signal lines $22_1$ to $22_m$, and are connected to the column processing unit 17 through n pieces of vertical signal lines $23_1$ to $23_n$. In the pixel array unit 12, the pixels $21_{11}$ to $21_{mn}$ drive per row according to a control signal provided by the row scanning unit 15 through the horizontal signal lines $22_1$ to $22_m$, and output a pixel signal at a level according to a light reception amount of received light, through the vertical signal lines $23_1$ to $23_n$.

The timing control unit 13 generates a signal based on a master clock signal MCK, and controls timing in which the reference-signal generating circuit 14, the row scanning unit 15, the column scanning unit 16, and the column processing unit 17 operate. For example, the timing control unit 13 generates a clock signal CLK to be a reference of an operation of the reference-signal generating circuit 14 and the column processing unit 17, to provide to the reference-signal generating circuit 14 and the column processing unit 17. Moreover, the timing control unit 13 generates a control signal CS1 to control an operation of the reference-signal generating circuit 14, to provide to the reference-signal generating circuit 14, or generates control signals CS2 and CS3 to control an operation of the column processing unit 17, to provide to the column processing unit 17.

The reference-signal generating circuit 14 generates a reference signal Vramp (so-called ramp signal) with which a voltage value decreases at a constant slope according to the clock signal CLK, and decrease of the voltage value starts at timing according to the control signal CS1, to provide to the column processing unit 17 through a reference signal wiring.

The row scanning unit 15 provides, to the pixels $21_{11}$ to $21_{mn}$, a control signal (for example, a transfer signal, a selection signal, a reset signal, and the like) to control driving of the pixels 2111 to the pixels $21_{11}$ to $21_{mn}$ of the pixel array unit 12 per row in timing according to a control of the timing control unit 13.

The column scanning unit 16 provides, to the column processing unit 17, a control signal to output a pixel signal subjected to AD conversion by the column processing unit 17 to a horizontal output line sequentially per column of the pixels $21_{11}$ to $21_{mn}$, in timing in accordance with a control of the timing control unit 13.

The column processing unit 17 includes n pieces of AD converter circuits $30_1$ to $30_n$ in the quantity corresponding to the number of columns of the pixels $21_{11}$ to $21_{mn}$ arranged in the pixel array unit 12, and the pixels $21_{11}$ to $21_{mn}$ are connected through the vertical signal lines $23_1$ to $23_n$. In the column processing unit 17, the AD converter circuits $30_1$ to $30_n$ subject pixel signals output from the pixels $21_{11}$ to $21_{mn}$ to AD conversion per column in parallel, to output.

The AD converter circuits $30_1$ to $30_n$ are respectively constituted of comparators $31_1$ to $31_n$, counters $32_1$ to $32_n$, switches $33_1$ to $33_n$, and memories $34_1$ to $34_n$. The AD converter circuits $30_1$ to $30_n$ are configured similarly, and are hereinafter referred to as an AD converter circuit 30 when it is not necessary to be distinguished from each other. Moreover, the same applies to the respective components constituting the AD converter circuit 30.

In the comparator 31, one input terminal is connected to the pixel 21 through the vertical signal line 23, the other input terminal is connected to the reference-signal generating circuit 14 through the reference-signal wiring, and an output terminal is connected to the counter 32. The comparator 31 compares a voltage of a pixel signal input through the vertical signal line 23 and a voltage of the reference signal Vramp provided by the reference-signal generating circuit 14, and outputs a high level signal, for example, when the voltage of the reference signal Vramp is larger than the voltage of the pixel signal, and outputs a low level signal when the voltage of the reference signal Vramp is equal to or smaller than the voltage of the pixel signal. Specific circuit configuration of the comparator 31 will be described later. In the present embodiment, the comparator 31 is configured to be able to temporally switch between an input of the pixel signal and an input of the reference signal Vramp as described later, and thereby expands a dynamic range compared to the conventional comparators.

The counter 32 performs counting synchronized with the clock signal CLK provided by the timing control unit 13, in accordance with the control signal CS2 provided by the timing control unit 13. For example, the counter 32 counts up or counts down in synchronization with the clock signal CLK to measure a comparison period from a star of comparison operation to an end of the comparison operation in the comparator 31.

The switch 33 is turned into an ON (closed) state at the time when the counting operation of the counter 32 for the pixels 21 of a predetermined row is completed in accordance with the control signal CS3 provided by the timing control unit 13. The switch 33 transfers a counting result, that is, a pixel signal that has been converted from an analog signal to a digital signal, to the memory 34.

The memory 34 outputs a pixel signal held therein to the horizontal output line in accordance with a control signal provided by the column scanning unit 16.

Next, a configuration of the pixel 21 will be explained with reference to FIG. 4.

Figure 4:
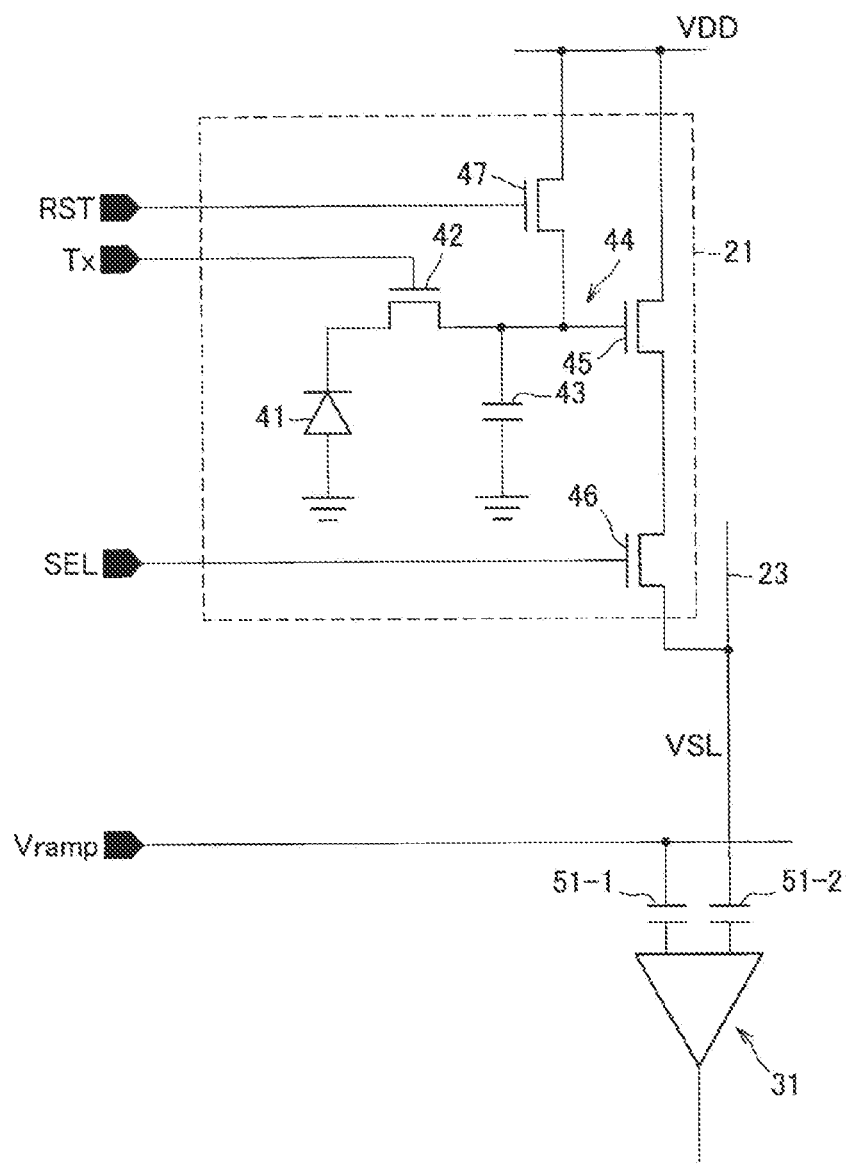
FIG. 4 is an explanatory diagram for explaining about a circuit configuration example of a pixel.

As illustrated in FIG. 4, the pixel 21 includes a photodiode 41, a transfer transistor 42, a charge accumulation unit 43, an FD unit 44, an amplification transistor 45, a selection transistor 46, and a reset transistor 47.

The photodiode 41 is a photoelectric converting unit that converts light into an electric charge, and generates an electric charge according to a light amount of received light by photoelectric conversion and accumulates it. An anode electrode of the photodiode 41 is grounded, and a cathode electrode of the photodiode 41 is connected to a gate electrode of the amplification transistor 45 through the transfer transistor 42.

The transfer transistor 42 drives according to a transfer signal Tx provided by the row scanning unit 15 in FIG. 3. For example, when the transfer signal Tx provided to a gate electrode of the transfer transistor 42 becomes high level, the transfer transistor 42 is turned ON, and the electric charge accumulated in the photodiode 41 is transferred to the FD unit 44 through the transfer transistor 42.

The charge accumulation unit 43 is a capacity that is provided between the FD unit 44 and the ground level, and accumulates an electric charge transferred from the photodiode 41 to the FD unit 44 through the transfer transistor 42.

The FD unit 44 is a charge detecting unit that converts an electric charge into a voltage, and the electric charge held by the FD unit 44 is converted into a voltage in the amplification transistor 45.

The amplification transistor 45 serves as an input unit of a source follower, which is a reader circuit that reads a signal obtained by photoelectric conversion in the photodiode 41, and outputs a pixel signal at a level according to the electric charge accumulated in the FD unit 44 to the vertical signal line 23. That is, the amplification transistor 45 composes an electric current source and a source follower that are connected to one end of a column signal line 22, as a source electrode thereof is connected to the column signal line 22 through the selection transistor 46.

The selection transistor 46 drives in accordance with a selection signal SEL provided by the row scanning unit 15 in FIG. 3. For example, when the selection signal SEL provided to a gate electrode of the selection transistor 46 becomes high level, it is turned ON to connect the amplification transistor 45 and the vertical signal line 23, and brings it to a state in which an output signal VSL output from the amplification transistor 45 can be output to the vertical signal line 23.

The reset transistor 47 drives in accordance with a reset signal RST provided by the row scanning unit 15 in FIG. 3. For example, when the reset signal RST provided to a gate electrode of a reset transistor 37 becomes high level, it is turned ON to discharge the electric charge accumulated in the FD unit 44, and resets the FD unit 44.

Moreover, the vertical signal line 23 is connected to one input terminal of the comparator 31 through a capacitor 51-2, and the other input terminal of the comparator 31 is connected to the reference-signal generating circuit 14 that provides the reference signal Vramp through the capacitor 51-1.

In the solid-state imaging device 11 thus configured, the electric charge accumulated in the photodiode 41 is transferred to the FD unit 44 all together to be read sequentially per column, and the simultaneity of shutter close can be thereby maintained.

Furthermore, in the solid-state imaging device 11, a D-phase priority reading in which a signal level (D phase) in a state in which the electric charge generated in the photodiode 41 is held in the FD 44 is read first, and then a reset level (P phase) in a state in which the electric charge in the FD unit 44 is discharged through the reset transistor 47 is read may be performed. As for the D-phase priority reading, details thereof are described, for example, in JP-A-2014-197773.

However, in conventional comparators as described in JP-A-20140197773, a decrease of the P phase margin originated in an unbalanced state between left and right in a differential pair of a first amplifier (first level amplifier), or a deviation of an offset of a second amplifier (latter level amplifier) has occurred at the time of performing setting operation of an initial voltage (auto-zero action) inside. In the present embodiment, a comparator that is capable of suppressing such a decrease of a P phase margin is provided.

Figure 5:
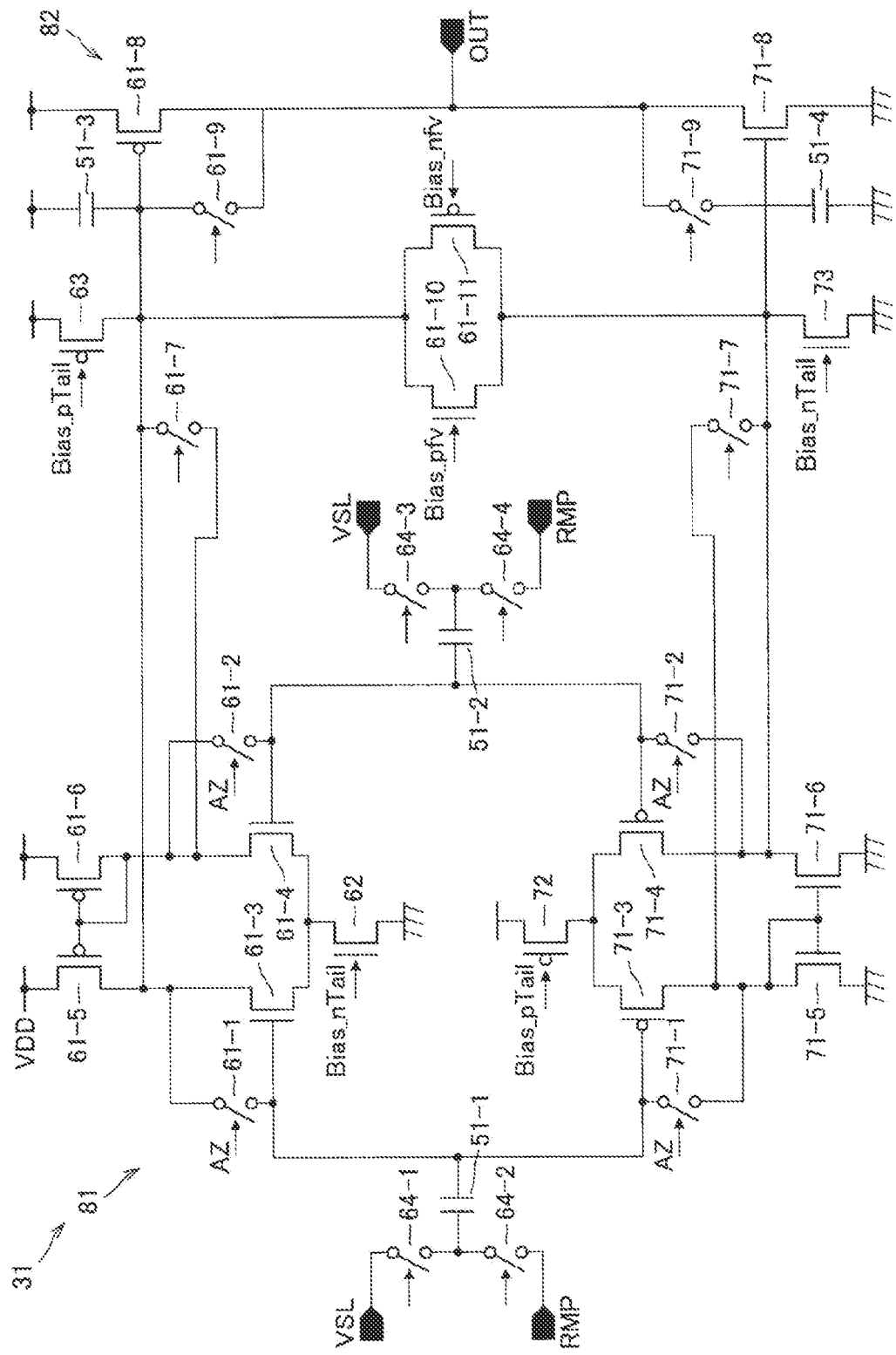
FIG. 5 is an explanatory diagram illustrating a circuit configuration example of a comparator according to the embodiment of the present disclosure.

Subsequently, a circuit configuration example of the comparator 31 according to the embodiment of the present disclosure will be explained. FIG. 5 is a configuration example of the comparator 31 according to the embodiment of the present disclosure. Hereinafter, the circuit configuration example of the comparator 31 according to the embodiment of the present disclosure will be explained with reference to FIG. 5.

As illustrated in FIG. 5, the comparator 31 according to the embodiment of the present disclosure includes a first amplifier 81 and a second amplifier 82.

The first amplifier 81 is constituted of capacitors 51-1 to 51-2, transistors 61-1 to 61-6, 71-1 to 71-6, and electric current sources 62, 72 combined. The transistors 61-3, 61-4, 71-5, 71-6 are NMOS transistors, and the transistors 61-5, 61-6, 71-3, 71-4 are PMOS transistors. Moreover, the electric current source 62 is constituted of an NMOS transistor, and the electric current source 72 is constituted of a PMOS transistor. To a gate of the electric current source 62, a fixed electric potential Bias_nTail is applied, and to a gate of the electric current source 72, a fixed electric potential Bias_pTail is applied. The transistors 61-1, 61-2, 71-1, 71-2 may be NMOS transistors or PMOS transistors, as long as the type thereof is identical.

Moreover, the second amplifier 82 is constituted of capacitors 51-3 to 51-4, transistors 61-7 to 61-11, 71-7 to 71-9, and electric current sources 63, 73 combined. The transistors 61-10, 71-8 are NMOS transistors, and the transistors 61-8, 61-11 are PMOS transistors. To a gate of the transistor 61-10, a fixed electric potential Bias_pfv is applied, and to a gate of the transistor 61-11, a fixed electric potential Bias_nfv is applied. Moreover, the electric current source 63 is constituted of a PMOS transistor, and the electric current source 73 is constituted of an NMOS transistor. To a gate of the electric current source 63, the fixed electric current Bias_pTail is applied, and to a gate of the electric current source 73, the fixed electric potential Bias_nTail is applied. The transistors 61-7, 61-9, 71-7, 71-9 may be NMOS transistors or PMOS transistors.

Moreover, in FIG. 5, switches 64-1 to 64-4 to switch the input to the comparator 31 are illustrated. The switches 64-1 to 64-4 may be NMOS transistors or PMOS transistors.

In the comparator 31, the transistors 61-3 and 61-4 have a source electrode connected in common to form a differential pair, and the electric current source 62 is connected to a portion between the common source electrode and a ground. Furthermore, in the comparator 31, the transistors 71-3 and 71-4 have a source electrode connected in common to form a differential pair, and the electric current source 72 is connected to a portion between a power source voltage VDD and the common source electrode.

The transistor 61-3 has a gate electrode connected to the vertical signal line 23 (FIG. 4) that provides an output signal VSL or to the reference-signal generating circuit 14 (FIG. 4) that provides a ramp signal RMP through the capacitor 51-1. Which one of the output signal VSL and the ramp signal RMP is output to the comparator 31 is determined by ON/OFF of the switches 64-1, 64-2. The transistor 61-4 has a gate electrode connected to the vertical signal line 23 that provides the output signal VSL or to the reference-signal generating circuit 14 that provides the ramp signal RMP. Which one of the output signal VSL and the ramp signal RMP is output to the comparator 31 is determined by ON/OFF of the switches 64-3, 64-4.

The transistor 71-3 has a gate electrode connected to the vertical signal line 23 that provides the output signal VSL or to the reference-signal generating circuit 14 that provides the ramp signal RMP through the capacitor 51-1. Which one of the output signal VSL and the ramp signal RMP is output to the comparator 31 is determined by ON/OFF of the switches 64-1, 64-2. The transistor 71-4 has a gate electrode connected to the vertical signal line 23 that provides the output signal VSL or the reference-signal generating circuit 14 that provides the ramp signal RMP. Which one of the output signal VSL and the ramp signal RMP is output to the comparator 31 is determined by ON/OFF of the switches 64-3, 64-4.

The transistor 61-5 is connected between a drain electrode of the transistor 61-3 and the power source voltage VDD in a diode connection structure, that is, in a structure in which the gate electrode and the drain electrode are common. The transistor 61-6 is connected between the drain electrode of the transistor 61-4 and the power source voltage VDD.

Moreover, the gate electrode of the transistor 61-5 and the gate electrode of the transistor 61-6 are connected in common with each other.

The transistor 71-5 is connected between a drain electrode of the transistor 71-3 and the power source voltage VDD in a diode connection structure, that is, in a structure in which the gate electrode and the drain electrode are common. The transistor 71-6 is connected between the drain electrode of the transistor 71-4 and the ground. Moreover, the gate electrode of the transistor 71-5 and the gate electrode of the transistor 71-6 are connected in common with each other.

The transistor 61-1 is connected between a gate electrode and a drain electrode of the transistor 61-3, and to the gate electrode of the transistor 61-1, a control signal from the row scanning unit 15 (FIG. 3) is provided. The transistor 61-2 is connected between the gate electrode and the drain electrode of the transistor 61-4, and to the gate electrode of the transistor 61-2, a control signal from the row scanning unit 15 is provided.

The transistor 71-1 is connected between a gate electrode and a drain electrode of the transistor 71-3, and to the gate electrode of the transistor 71-1, a control signal from the row scanning unit 15 is provided. The transistor 71-2 is connected between the gate electrode and the drain electrode of the transistor 71-4, and to the gate electrode of the transistor 71-2, a control signal from the row scanning unit 15 is provided.

The transistor 61-8 is connected between an output terminal of the comparator 31 and the power source voltage VDD. A gate electrode of the transistor 61-8 is connected to a connecting point of the transistors 61-4 and 61-6.

The transistor 71-8 is connected between the output terminal of the comparator 31 and the ground. The gate electrode of the transistor 71-8 is connected to a connecting point of the transistors 71-4 and 71-6.

The electric current source 63 is connected between the power source voltage VDD and a gate electrode of the transistor 61-8. Moreover, the electric current source 63 is connected between the power source voltage VDD and a drain electrode of the transistor 61-10 and a source electrode of the transistor 61-11.

The electric current source 73 is connected between the ground and a gate electrode of the transistor 71-8. Moreover, the electric current source 73 is connected between the ground and a source electrode of the transistor 61-10 and a drain electrode of the transistor 61-11.

The comparator 31 is configured as described, and by a differential amplifier made up of a pair of the transistors 61-3, 61-4, a difference between the ramp signal RMP input to the gate electrode of the transistor 61-3 or the transistor 61-4 and the output signal VSL input to the gate electrode of the transistor 61-4 or the transistor 61-3 is amplified to be output. Furthermore, an output from the differential amplifier is amplified by a source-ground amplifier circuit constituted of the transistors 61-8 and 71-8, to be output from an output terminal OUT of the comparator 31.

The transistors 61-7, 71-7 are to switch the differential pairs. For example, when the transistor 61-7 is OFF and the transistor 71-7 is ON, an output signal and a ramp signal from a pixel are received from a pair of the transistors 61-3, 61-4, which are the NMOS transistors. On the other hand, when the transistor 61-7 is ON and the transistor 71-7 is OFF, an output signal and a ramp signal from a pixel are received from a pair of the transistors 71-3, 71-4, which are the PMOS transistors.

Switching ON and OFF of the transistors 61-7, 71-7, 64-1 to 64-4 illustrated in FIG. 5 is performed based on a control signal from the timing control unit 13.

The comparator 31 according to the embodiment of the present disclosure receives an output signal and a ramp signal from a pixel not only by the NMOS transistors but also by the PMOS transistors in the first amplifier 81. Furthermore, in the second amplifier 82 also, a source-ground amplifier circuit constituted of the NMOS transistor and the PMOS transistor is applied.

By configuring as illustrated in FIG. 5, the comparator 31 according to the embodiment of the present disclosure enables to lower a lower-limit input voltage, compared to a case in which an output signal and a ramp signal from a pixel are received only by the NMOS transistor in the first amplifier 81.

Figure 6:
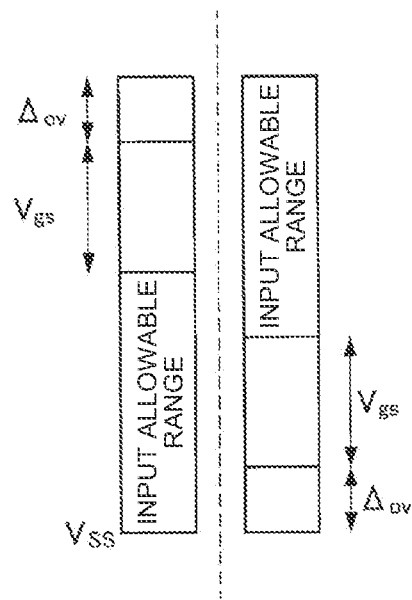
FIG. 6 is an explanatory diagram illustrating an example of an input allowable range by the comparator.

FIG. 6 is an explanatory diagram illustrating an example of an input allowable range by the comparator 31 according to the embodiment of the present disclosure. By receiving an input not only by the NMOS transistor, but also by the PMOS transistor in the first amplifier 81, a range of the lower-limit input voltage can be expanded toward a lower voltage side.

Therefore, by configuring as illustrated in FIG. 5, the comparator 31 according to the embodiment of the present disclosure can expand a dynamic range compared to a case of receiving only by the NMOS transistor in the first amplifier 81.

The comparator 31 according to the embodiment of the present disclosure switches a differential input and an output per line and/or per frame. By configuring to switch the differential input and the output per line and/or per frame, the comparator 31 according to the embodiment of the present disclosure is enabled to cancel variation of offset in the first amplifier temporally and/or spatially by the principle of error diffusion.

Figure 7:
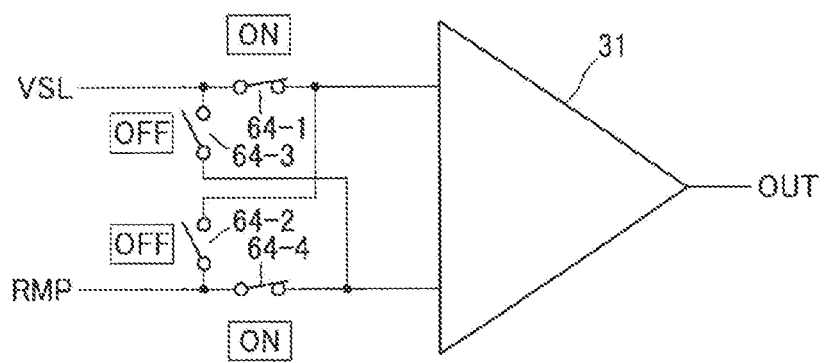
FIG. 7 is an explanatory diagram illustrating how variation in an offset voltage is temporally cancelled by the comparator.
Figure 8:
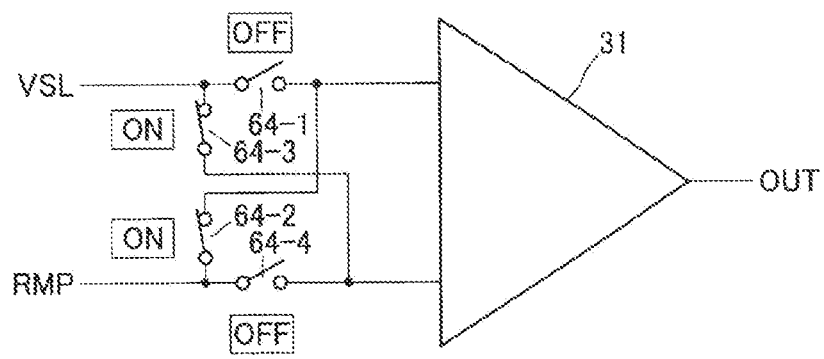
FIG. 8 is an explanatory diagram illustrating how variation in the offset voltage is temporally cancelled by the comparator.

FIGS. 7, 8 are explanatory diagrams illustrating how variation in an offset voltage is temporally cancelled by the comparator. FIG. 7 illustrates a state in which the output signal VSL and the ramp signal RMP are input to C1, C2 of the comparator 31, respectively in an N-th frame. FIG. 8 illustrates a state in which the output signal VSL and the ramp signal RMP are input to C2, C1 of the comparator 31, respectively in an N+1-th frame. In the following explanation, the state of input to the comparator 31 as illustrated in FIG. 7 is referred to as normal input, and the state of input as illustrated in FIG. 8 is referred to as reverse input also. Switching between the normal input and the reverse input is performed, for example, based on a control signal from the timing control unit 13.

When a difference occurs between ΔVDAC and ΔVSL caused by a characteristic difference between a parasitic capacity of the differential pair and the differential transistor of the comparator 31, it appears in an output characteristic as an offset voltage of the comparator 31. Because this offset voltage varies in reverse timing, the number of count in the ADC varies among columns. That is, it becomes a fixed pattern noise (FPN). Moreover, because it appears as variation in a characteristics of the P phase margin, the operation margin decreases. Therefore, to suppress the offset voltage of the differential pair of the comparator 31, as illustrated in FIGS. 7, 8, the normal input and the reverse input are switched temporally. By switching the input temporally, the comparator 31 can average the offset voltage.

Figure 9:
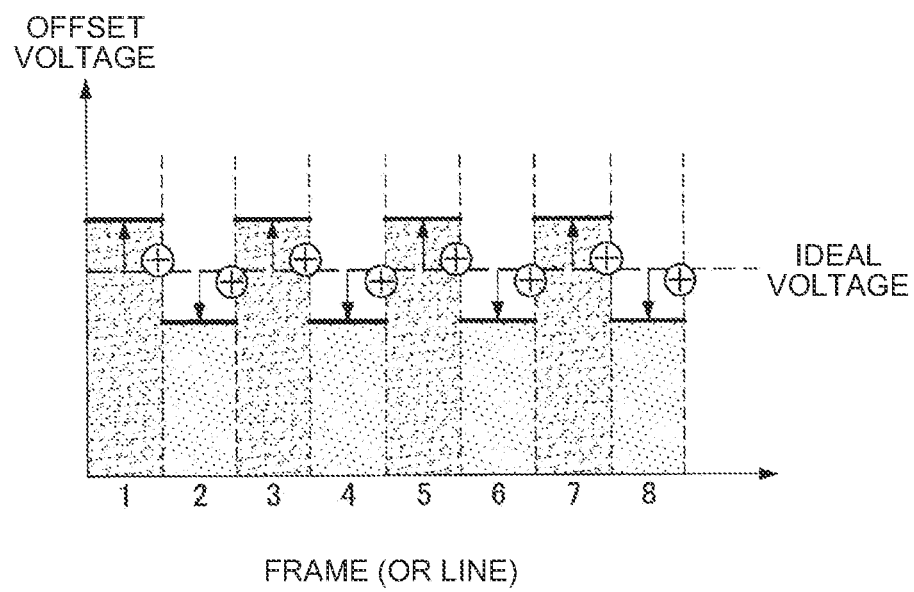
FIG. 9 is an explanatory diagram illustrating how the offset voltage of the comparator is averaged.

FIG. 9 is an explanatory diagram illustrating how the offset voltage of the comparator 31 is averaged. In a graph illustrated in FIG. 9, a vertical axis is for the offset voltage of the comparator 31, a horizontal axis is for a frame (or a line in a vertical direction). As illustrated in FIGS. 7 and 8, by switching the input to the comparator temporally (or spatially), the offset voltage of the comparator 31 fluctuates around an ideal voltage. Therefore, by switching the input temporally (or spatially), the offset voltage of the comparator 31 is averaged, and occurrence of the fixed pattern noise can be suppressed.

Figure 10:
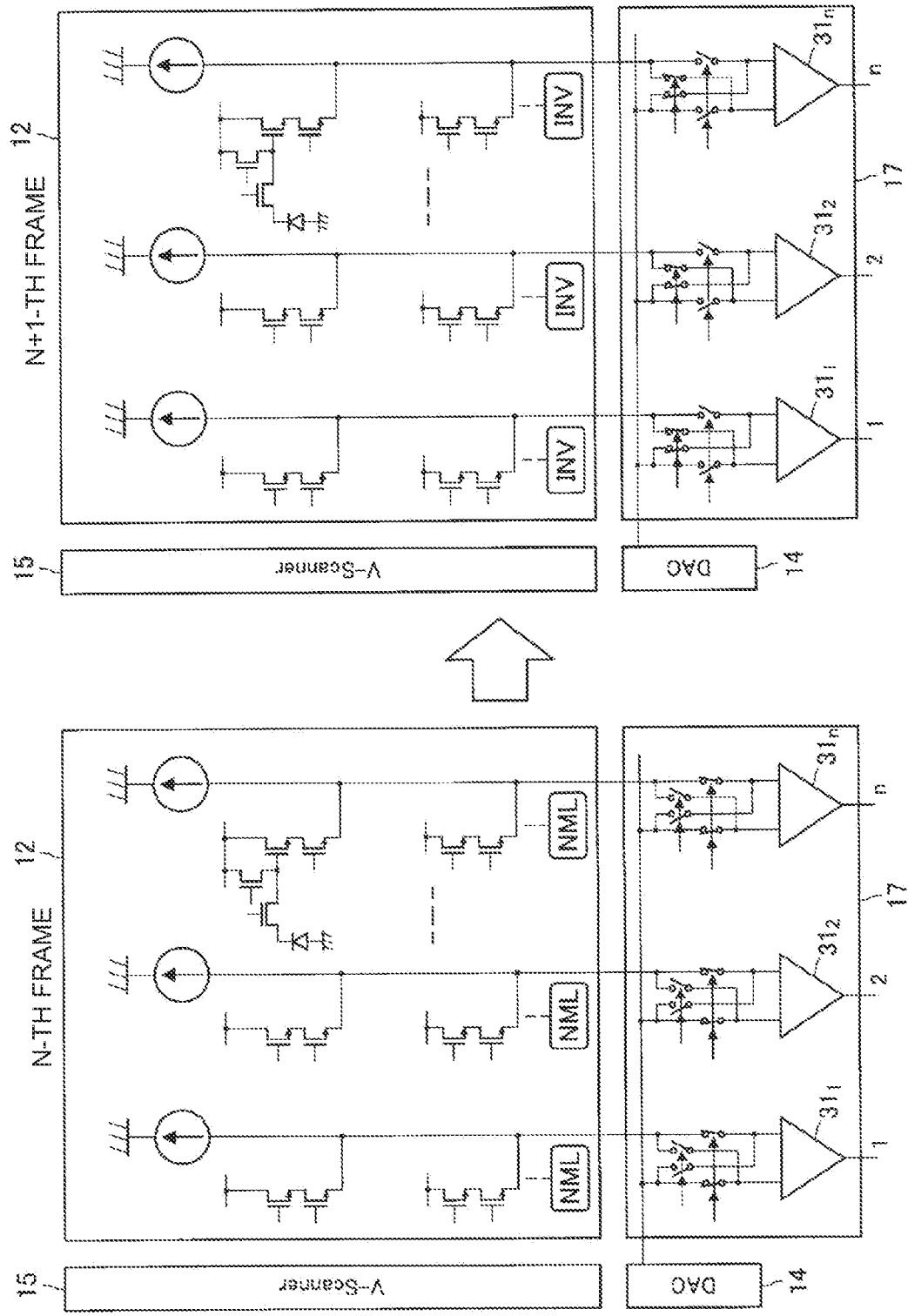
FIG. 10 is an explanatory diagram illustrating an example of switching an input to the comparator in a frame unit.

FIG. 10 is an explanatory diagram illustrating an example of switching the input to the comparator 31 in a frame unit. In the example illustrated in FIG. 10, the normal input is applied to all of lines in the N-th frame, and the reverse input is applied to all of the lines in the following N+1-th frame. By thus switching the input to the comparator 31 in a frame unit, the solid-state imaging device 11 can average the offset voltage of the comparator 31.

Figure 11:
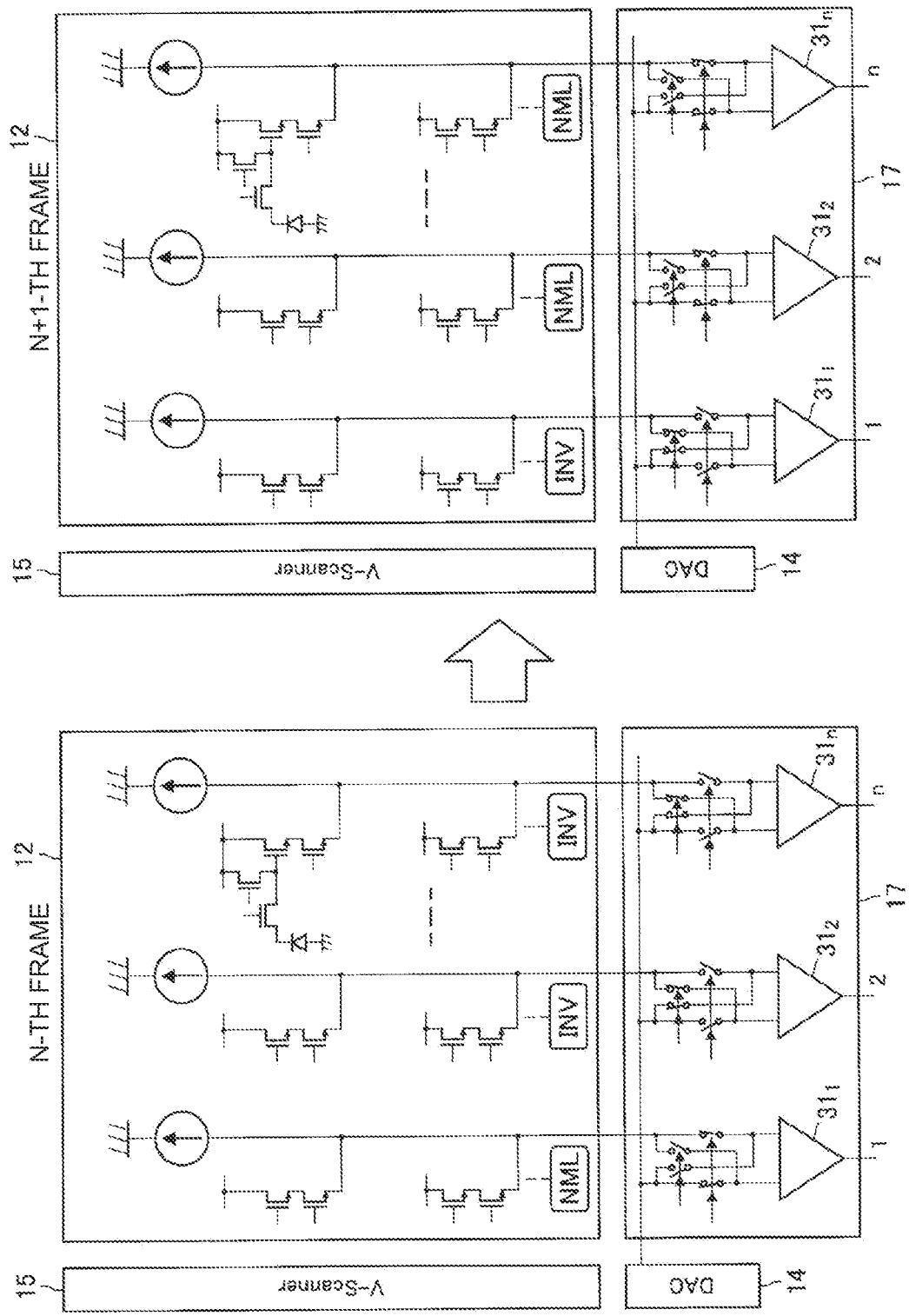
FIG. 11 is an explanatory diagram illustrating an example of switching an input to the comparator in a frame unit.

FIG. 11 is an explanatory diagram illustrating an example of switching the input to the comparator 31 in a frame unit. In the example illustrated in FIG. 11, the normal input is applied to odd lines, and the reverse input is applied to even lines in the N-th frame. Moreover, the reverse input is applied to odd lines, and the normal input is applied to the even lines in the N+1-th frame. By thus switching the input to the comparator 31 in a frame unit and an adjacent line unit, the solid-state imaging device 11 can average the offset voltage of the comparator 31.

Figure 12:
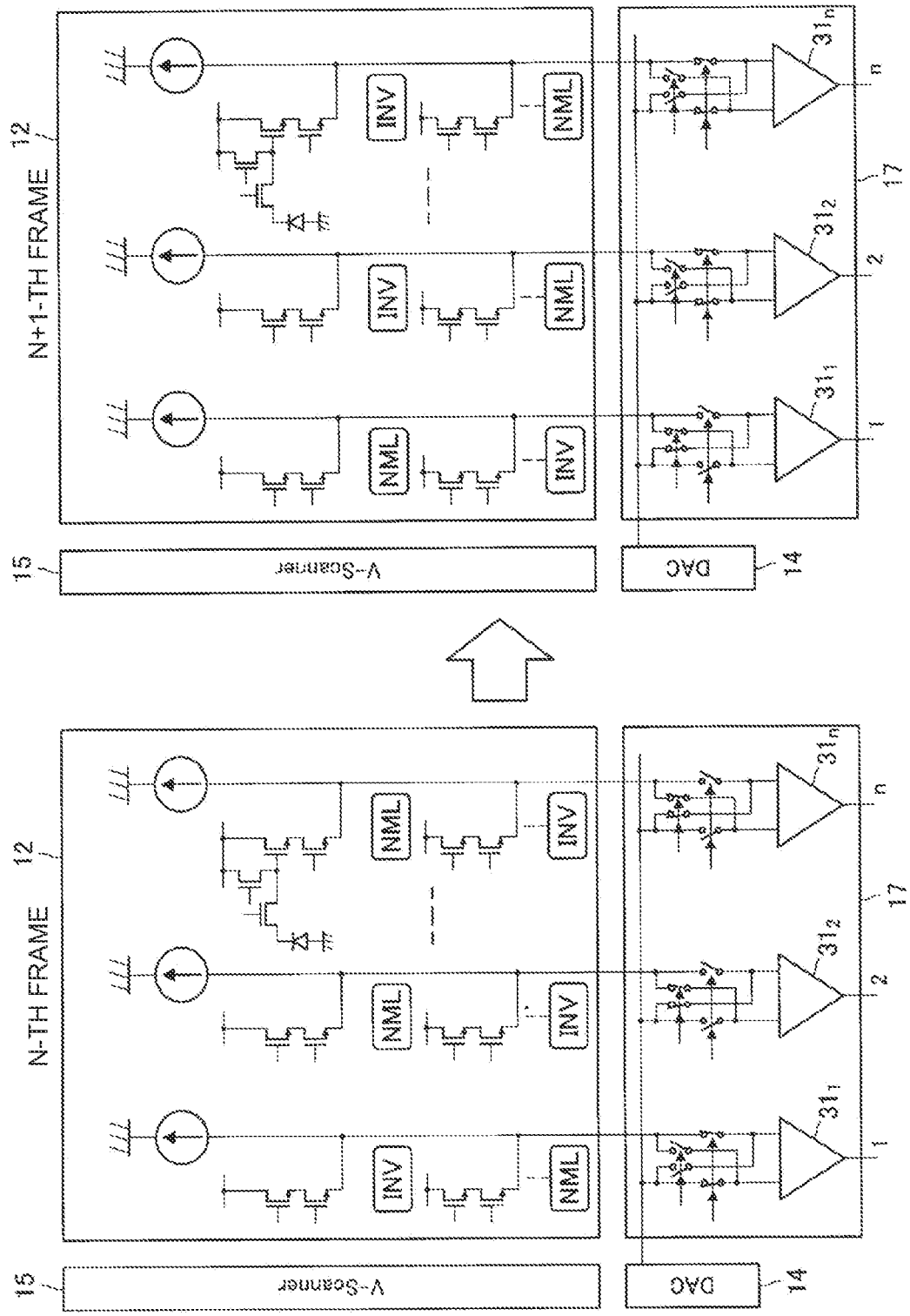
FIG. 12 is an explanatory diagram illustrating an example of switching an input to the comparator in a frame unit.

FIG. 12 is an explanatory diagram illustrating an example of switching the input to the comparator 31 in a frame unit. In the example illustrated in FIG. 12, the input to the comparator 31 is switched such that the normal input and the reverse input are alternate in a horizontal direction and a vertical direction in the N-th frame and the N+1-th frame. By thus switching the input to the comparator 31 in a frame unit and in the horizontal direction and the vertical direction, the solid-state imaging device 11 can average the offset voltage of the comparator 31.

The solid-state imaging device 11 according to the embodiment of the present disclosure can expand the dynamic range by receiving an output signal and a ramp signal from a pixel not only by the NMOS transistor, but also by the PMOS transistor. Moreover, the solid-state imaging device 11 according to the embodiment of the present disclosure can cancel the offset voltage of the comparator and average to an ideal voltage, by switching the differential input and the output of the comparator 31 per frame and/or per line.

The solid-state imaging device 11 according to the embodiment of the present disclosure can make wirings of the comparator 31 symmetric by switching the differential input and the output of the comparator 31 between the normal input and the reverse input. Being able to make the wirings of the comparator 31 symmetric, an influence of the parasitic capacity occurring inside and between adjacent pixels in the conventional comparators can be eliminated.

Figure 13:
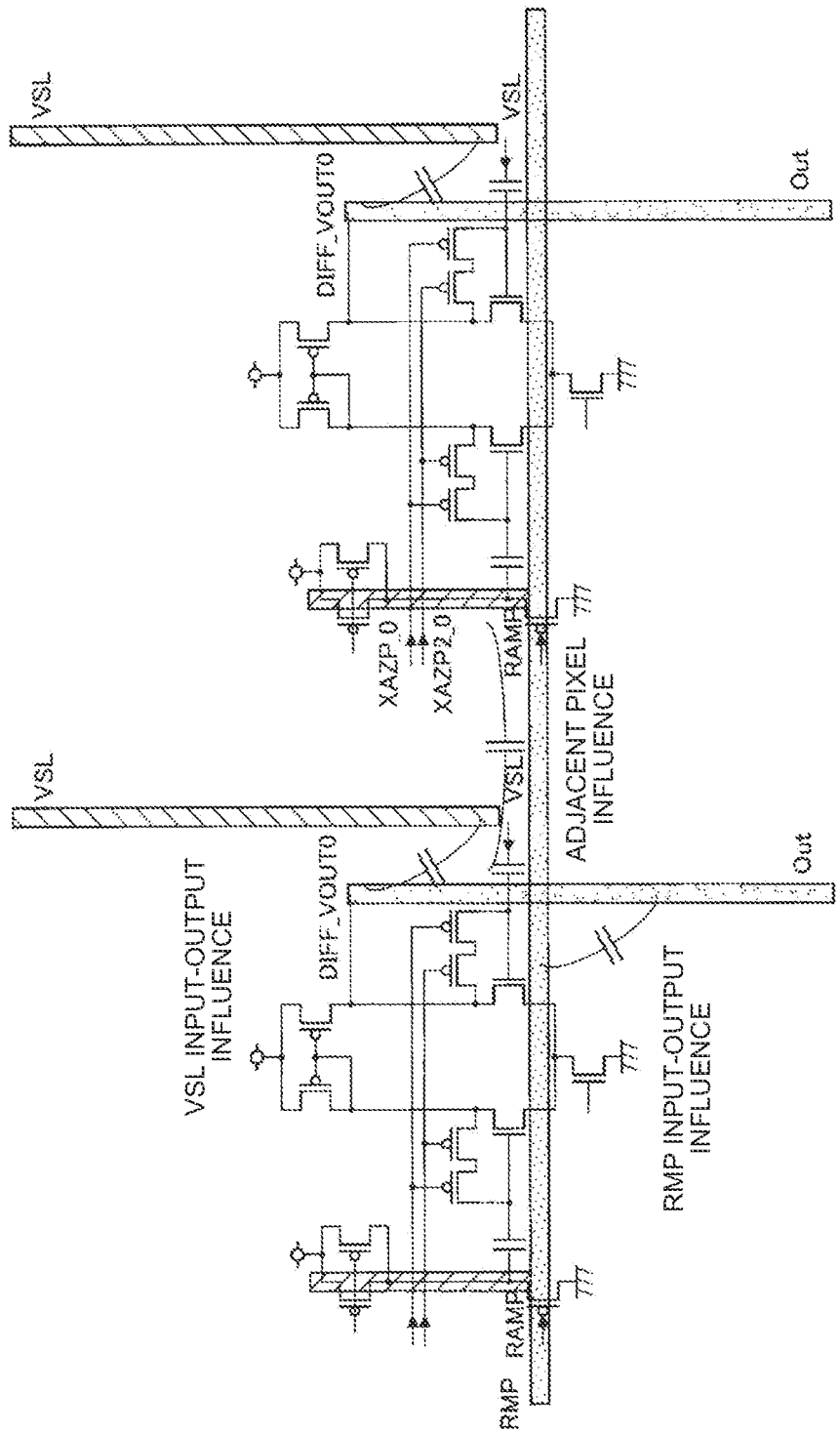
FIG. 13 is an explanatory diagram for explaining an influence of a parasitic capacity caused by a wiring occurring inside and between adjacent pixels in a conventional comparator.

FIG. 13 is an explanatory diagram for explaining an influence of a parasitic capacity caused by wiring occurring inside and between adjacent pixels in a conventional comparator. In the conventional comparator, for example, a parasitic capacity between a wiring of an input of the output signal VSL from a pixel to the comparator and a wiring of an output from the comparator, a parasitic capacity between a wiring of an input of the ramp signal to the comparator and a wiring of an output from the comparator, and a parasitic capacity by a wiring between adjacent pixels are present. The presence of these parasitic capacities influence an output of the other comparator. For example, the presence of the parasitic capacity causes deterioration of the image quality, such as occurrence of streaking (stripes and streaks).

Figure 14:
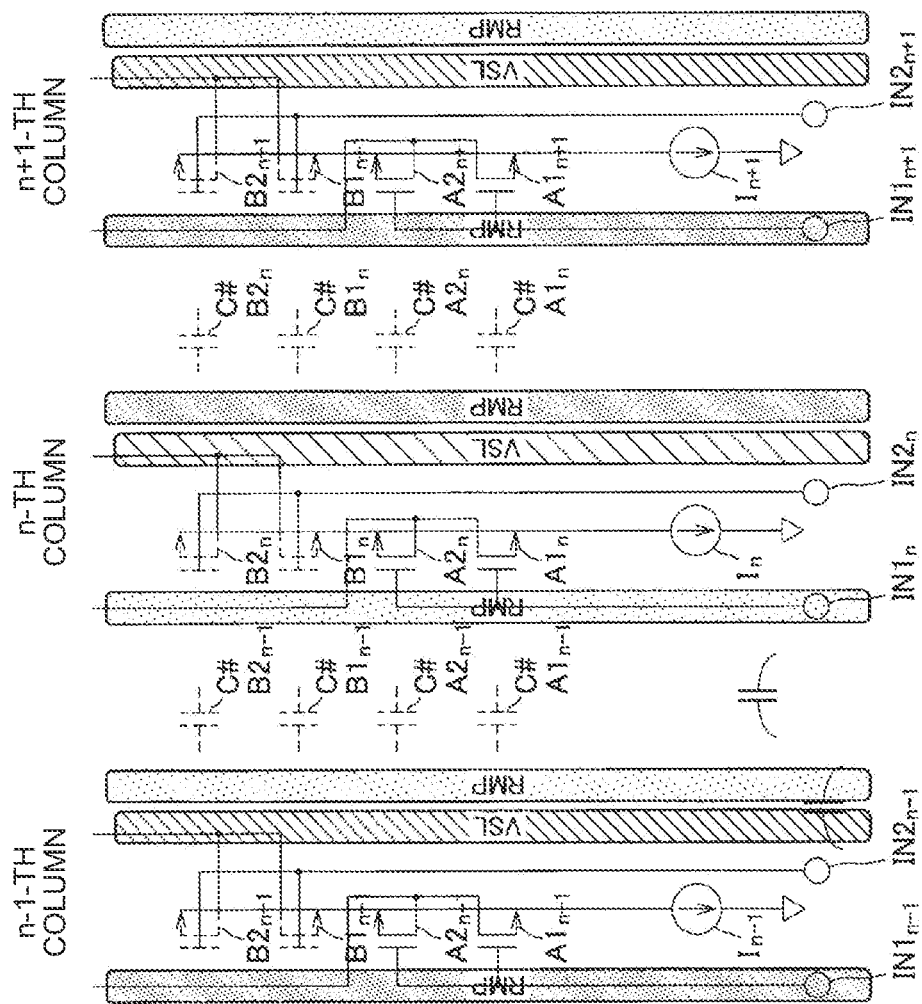
FIG. 14 is an explanatory diagram for explaining an influence of a parasitic capacity caused by wiring inside and between adjacent pixels occurring in a conventional comparator.

FIG. 14 is an explanatory diagram for explaining an influence of a parasitic capacity caused by wiring to transistors constituting a differential pair in a conventional comparator. In FIG. 14, an example of arrangement of FET#A1$_n$ and FET#A2$_n$, and FET#B1$_n$ and FET#B2$_n$ that are divided parts of the transistors constituting the differential pair, in a column region is also illustrated. In the configuration illustrated in FIG. 14, a parasitic capacity C#A1$_{n-1}$ has occurred between FET#A1$_{n-1}$ of the n–1-th column and FET#A1$_n$ of the n-th column opposing to each other. Similarly, a parasitic capacity C#A2$_{n-1}$ has occurred between FET#A2$_{n-1}$ of the n–1-th column and FET#A2$_n$ of the n-th column opposing to each other, a parasitic capacity C#B1$_{n-1}$ has occurred between FET#B1$_{n-1}$ of the n–1-th column and FET#B1$_n$ of the n-th column opposing to each other, and a parasitic capacity C#B2$_{n-1}$ has occurred between FET#B2$_{n-1}$ of the n–1-th column and FET#B2$_n$ of the n-th column opposing to each other. In the conventional comparator, the output signal VSL from a pixel is input to one of the differential pair, and the ramp signal is input to the other. Therefore, the conventional comparator has a structure apt to receive an influence of a parasitic capacity between wirings.

On the other hand, the comparator 31 used in the solid-state imaging device 11 according to the embodiment of the present disclosure has a configuration enabling to switch the differential input and the output per frame and/or per line. Therefore, the comparator 31 has a symmetrical layout of wirings, and an influence of capacity coupling to the wirings inside the comparator 31 or of the adjacent comparator 31 can be reduced by a reverse phase pulse.

Figure 15:
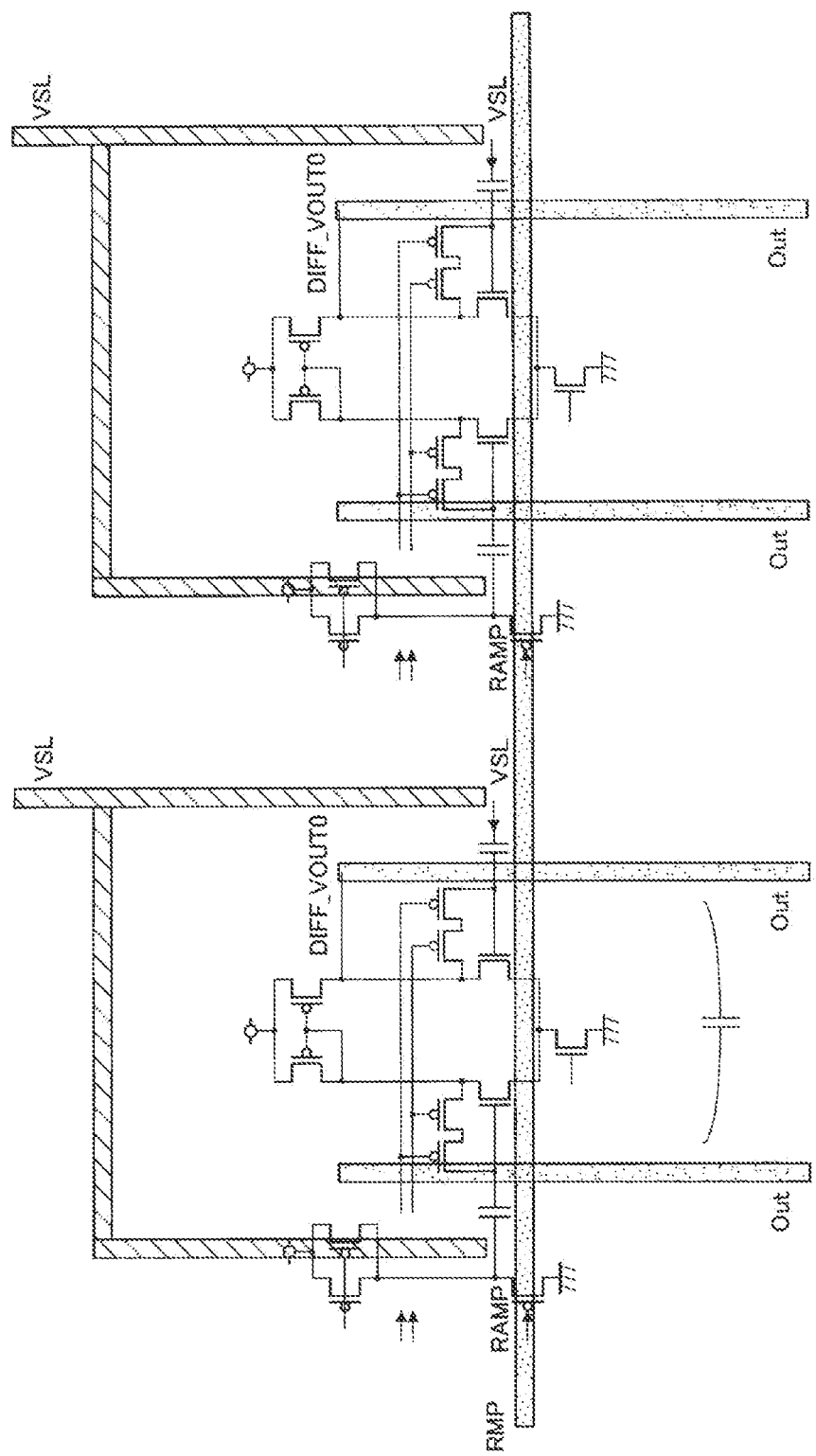
FIG. 15 is an explanatory diagram illustrating a layout example of wirings of a comparator that is used in the solid-state imaging device according to an embodiment of the present disclosure.

FIG. 15 is an explanatory diagram illustrating a layout example of wirings of the comparator 31 that is used in the solid-state imaging device 11 according to the embodiment of the present disclosure. The comparator 31 used in the solid-state imaging device 11 according to the embodiment of the present disclosure is enabled to symmetrically set a layout of a wiring for input of the output signal VSL from a pixel, a wiring for input of the ramp signal, and a wiring for output from the comparator 31. Therefore, the comparator 31 that is used in the solid-state imaging device 11 according to the embodiment of the present disclosure can reduce an influence of capacity coupling to the wirings inside or of the adjacent comparator 31.

Figure 16:
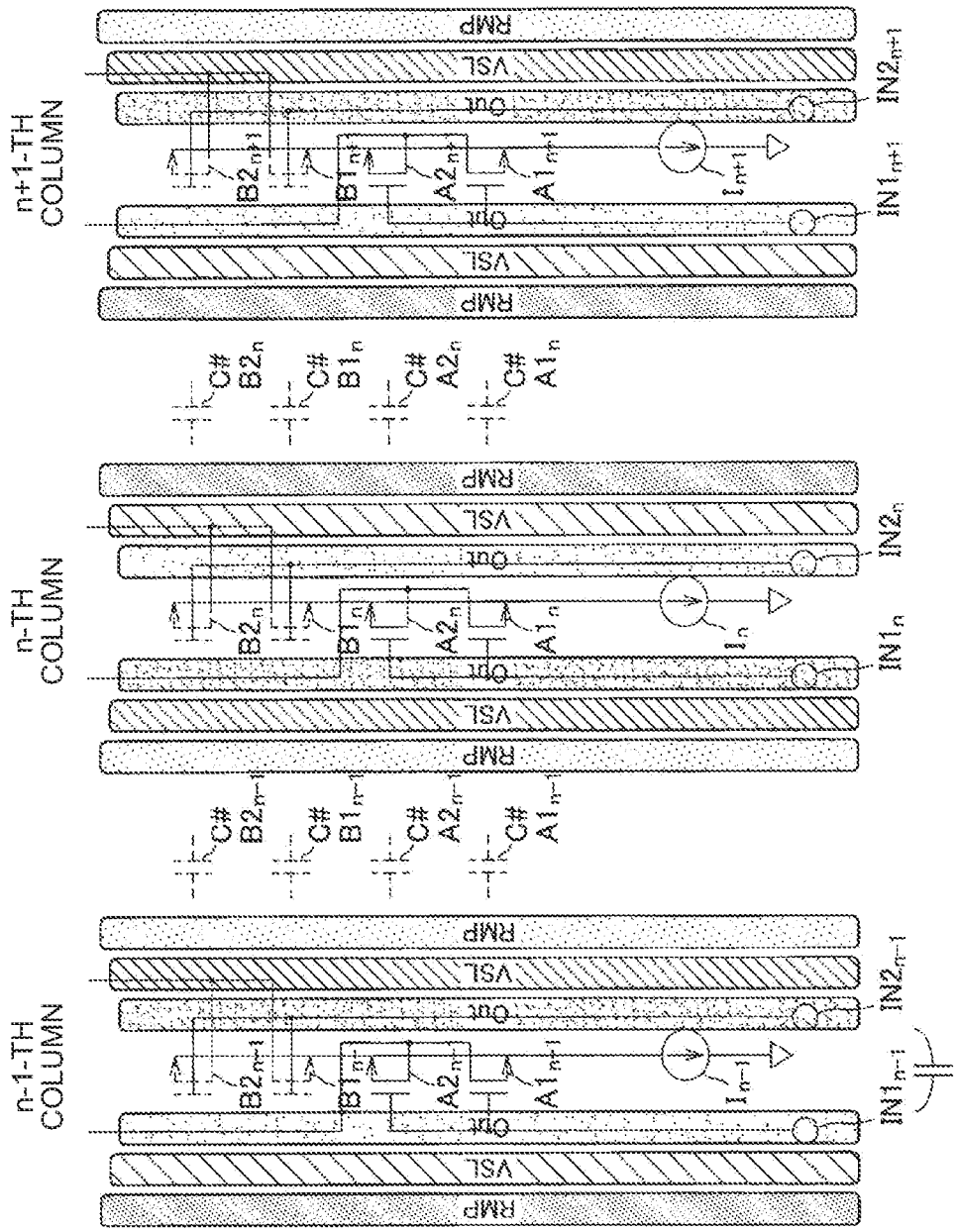
FIG. 16 is an explanatory diagram illustrating a wiring example for a transistor constituting a differential pair of the comparator.

FIG. 16 is an explanatory diagram illustrating a wiring example for a transistor constituting a differential actuator pair of the comparator 31 that is used in the solid-state imaging device 11 according to the embodiment of the present disclosure. In FIG. 16 also, an example of arrangement of FET#A1$_n$ and FET#A2$_n$, and FET#B1$_n$ and FET#B2$_n$ that are divided parts of the transistors constituting the differential pair, in a column region and parasitic capacities of the respective transistors are also illustrated similarly to FIG. 14. As illustrated in FIG. 16, the comparator 31 can make wirings symmetric in each column. Therefore, the comparator 31 that is used in the solid-state imaging device 11 according to the embodiment of the present disclosure can make the input and output with respect to the differential pair symmetric, and can implement a wiring layout that suppresses an influence of capacity coupling that has been occurring in the conventional comparators.

<2. Example of Application to Electronic Device>

The technique according to the present disclosure can be applied to an imaging device that is provided in a digital camera, a digital still camera, a mobile phone, a tablet terminal, a personal computer, and the like. Moreover, the technique according to the present disclosure may be implemented as a device mounted on any type of mobile objects of a vehicle, an electric vehicle, a hybrid electric vehicle, a motorcycle, a bicycle, a personal mobility, an airplane, a drone, a boat, a robot, and the like. Application of the technique according to the present disclosure to such a device enables to reduce power consumption of the imaging device, and to generate an image in which a noise originated in analog characteristics of a column reading circuit is reduced.

Figure 17:
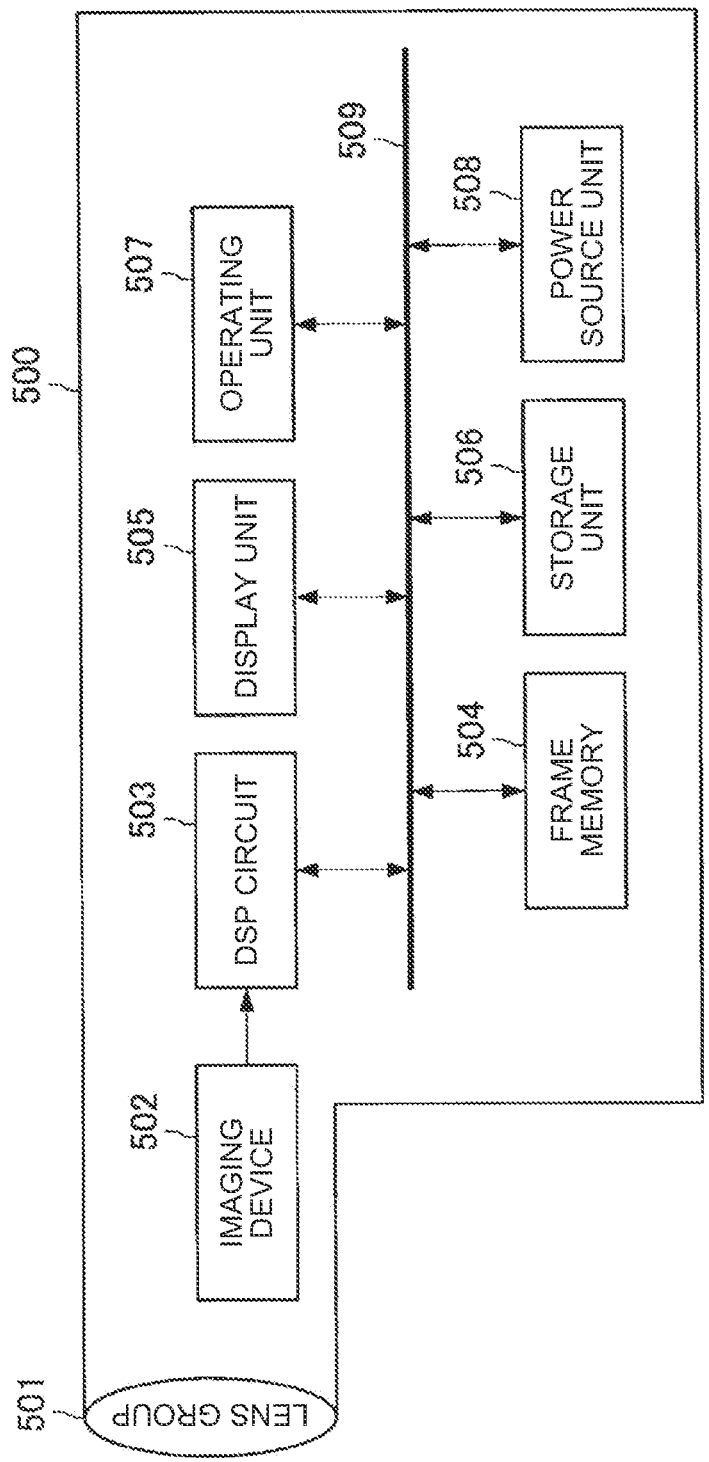
FIG. 17 is an explanatory diagram illustrating a configuration example of an electronic device in which the solid-state imaging device according to an embodiment of the present disclosure is applied.

FIG. 17 is an explanatory diagram illustrating a configuration example of an electronic device 500 in which the solid-state imaging device 11 according to the embodiment of the present disclosure is applied.

The electronic device 500 is, for example, an electronic device, such as an imaging device including a digital still camera, a video camera, and the like, and a mobile terminal device including a smartphone, a tablet terminal, and the like.

In FIG. 21, the electronic device 500 includes a lens 501, an imaging device 502, a DSP circuit 503, a frame memory 504, a display unit 505, a recording unit 506, an operating unit 507, and a power source unit 508. Moreover, in the electronic device 500, the DSP circuit 503, the frame memory 504, the display unit 505, the recording unit 506, the operating unit 507, and the power source unit 508 are connected to each other thorough a bus line 509.

As the imaging device 502, the solid-state imaging device 11 in FIG. 3 can be applied.

The DSP circuit 503 is a signal processing circuit that processes a signal provided by the imaging device 502. The DSP circuit 503 outputs image data acquired by processing the signal from the imaging device 502. The frame memory 504 temporarily holds the image data processed by the DSP circuit 503 in a frame unit.

The display unit 505 is constituted of, for example, a panel display device including a liquid crystal panel, an organic electroluminescence (EL) panel, and the like, and displays a moving image or a still image captured by the imaging device 502. The recording unit 506 records image data of a moving image or a still image captured by the imaging device 502 in a recording medium, such as a semiconductor memory and a hard disk.

The operating unit 507 outputs an operation instruction about various kinds of functions of the electronic device 500, in accordance with an operation by a user. The power source unit 508 supplies various kinds of power sources to be an operating power of the DSP circuit 503, the frame memory 504, the display unit 505, the recording unit 506, and the operating unit 507, to those to be supplied with power appropriately.

<3. Example of Application to Mobile Object>

The technique (the present technique) according to the present disclosure can be applied to various products. For example, the technique according to the present disclosure may be implemented as a device mounted on any type of mobile objects of a vehicle, an electric vehicle, a hybrid electric vehicle, a motorcycle, a bicycle, a personal mobility, an airplane, a drone, a boat, a robot, and the like.

Figure 18:
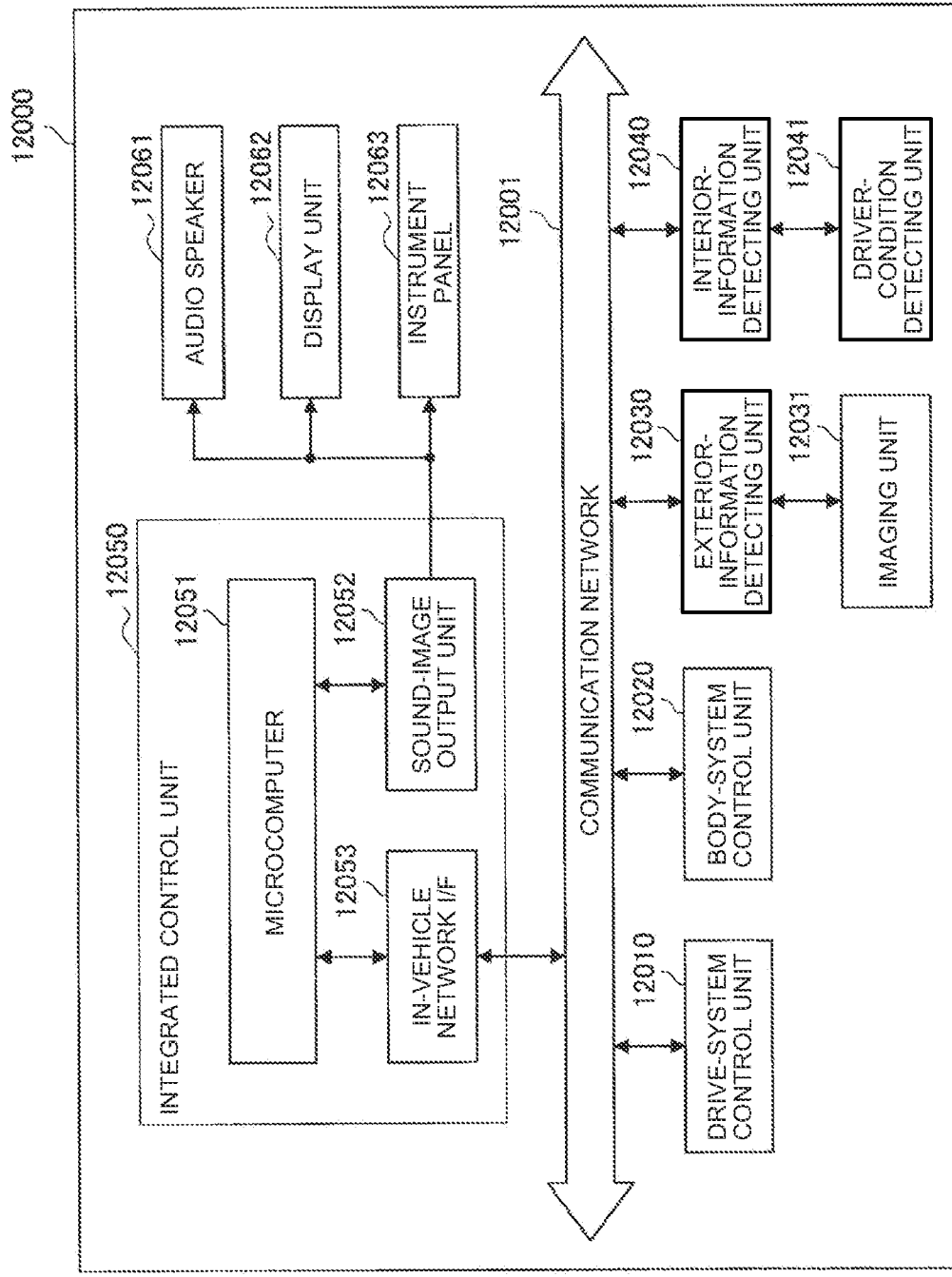
FIG. 18 is a block diagram illustrating an example of a schematic configuration of a vehicle control system.

FIG. 18 is a block diagram illustrating an example of a schematic configuration of a vehicle control system, that is one example of a mobile-object control system to which the technique according to the present disclosure can be applied.

A vehicle control system 12000 includes plural electronic control units connected through a communication network 12001. In the example illustrated in FIG. 18, the vehicle control system 12000 includes a drive-system control unit 12010, a body-system control unit 12020, an exterior-information detecting unit 12030, an interior-information detecting unit 12040, and an integrated control unit 12050. Moreover, as functional components of the integrated control unit 12050, a microcomputer 12051, a sound-image output unit 12052, and an in-vehicle network interface (I/F) 12053 are illustrated.

The drive-system control unit 12010 controls an operation of a device relating to a drive system of a vehicle in accordance with various kinds of programs. For example, the drive-system control unit 12010 functions as a driving-force generating device to generate a driving force of the vehicle, such as an internal combustion engine or a driving motor, a driving-force transmission mechanism to transmit a driving force to wheels, a steering mechanism to adjust steering of the vehicle, and a control device such as a braking device that generates a braking force of the vehicle.

The body-system control unit 12020 controls operations of various kinds of devices equipped in the vehicle, in accordance with various kinds of programs. For example, the body-system control unit 12020 functions as a keyless entry system, a smart key system, a power window device, or a control device of various kinds of lamps including head lamps, backup lamps, stop lamps, direction-indicator lamps, fog lamps, and the like. In this case, to the body-system control unit 12020, radio waves that substitute as a key emitted from a portable device or signals of various kinds of switches can be input. The body-system control unit 12020 receives an input of these radio waves and signals, and controls a door lock device, a power window device, lamps, and the like of the vehicle.

The exterior-information detecting unit 12030 detects information of an exterior of the vehicle equipped with the vehicle control system 12000. For example, to the exterior-information detecting unit 12030, an imaging unit 12031 is connected. The exterior-information detecting unit 12030 receives cause the imaging unit 12031 to take an image outside the vehicle, and receives the image taken. The exterior-information detecting unit 12030 may perform object detection processing for a human, a vehicle, an obstacle, a road sign, character information on a road, or the like, or distance detection processing based on the received image.

The imaging unit 12031 is an optical sensor that receives light, and that outputs an electrical signal according to a light reception amount of the light. The imaging unit 12031 can output the electrical signal as an image, and can output as ranging information. Moreover, light received by the imaging unit 12031 may be visible light or invisible light including an infrared ray, and the like.

The interior-information detection unit 12040 detects information inside the vehicle. To the interior-information detecting unit 12040, for example, a driver-condition detecting unit 12041 that detects a condition of a driver is connected. The driver-condition detecting unit 12041 includes, for example, a camera to image the driver, and the interior-information detecting unit 12040 may calculate a degree of tiredness or a degree of concentration, or may determine whether the driver is not asleep.

The microcomputer 12051 calculates a control target value of the driving-force generating device, the steering mechanism, or the braking device based on information of the inside and the outside of the vehicle acquired by the exterior-information detecting unit 12030 or the interior-information detecting unit 12040, and can output a control command to the drive-system control unit 12010. For example, the microcomputer 12051 can perform a coordinate control aimed to implement functions of advanced driver assistance system (ADAS) including collision avoidance or impact attenuation of the vehicle, cruise based on a distance between vehicles, speed-maintained driving, vehicle collision alert, lane departure alert, or the like.

Moreover, the microcomputer 12051 can perform coordinate control aimed to implement unattended operation to autonomously drive not by the operation by a driver, by controlling the driving-force generating device, steering mechanism, the braking device, or the like based on the information around the vehicle acquired by the exterior-information detecting unit 12030 or the interior-information detecting unit 12040.

Furthermore, the microcomputer 12051 can output a control command to the body-system control unit 12020 based on information of the outside of the vehicle acquired by the exterior-information detecting unit 12030. For example, the microcomputer 12051 can perform a coordinate control aimed to avoid glare by controlling the head lamps according to a position of a vehicle running ahead or a vehicle in the opposite lane detected by the exterior-information detecting unit 12030, to switch from high beam to low beam, or the like.

The sound-image output unit 12052 transmits an output signal of at least one of a sound and an image to an output device that can notify of information visually or aurally with respect to a passenger of the vehicle or the outside of the vehicle. In the example in FIG. 18, as the output device, an audio speaker 12061, a display unit 12062, and an instrument panel 12063 are illustrated. The display unit 12062 may include, for example, at least one of an on-board display and a head-up display.

Figure 19:
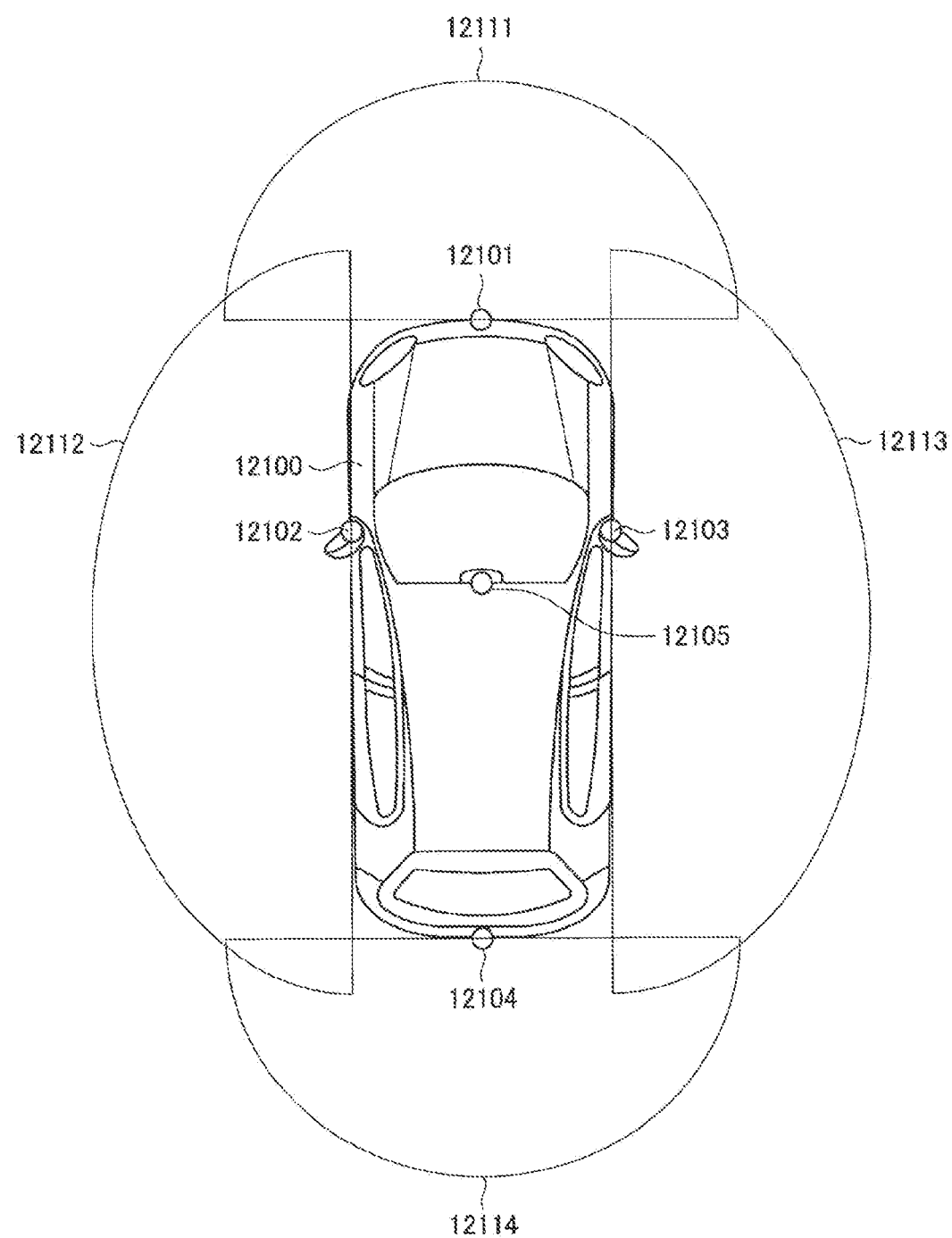
FIG. 19 is an explanatory diagram illustrating an example of arrangement positions of an exterior-information detecting unit and an imaging unit.

FIG. 19 is a diagram illustrating an example of an installation position of the imaging unit 12031.

In FIG. 19, as the imaging unit 12031, imaging units 12101, 12102, 12103, 12104, 12105 are included.

The imaging units 12101, 12102, 12103, 12104, 12105 are arranged, for example, at positions in a front nose, a side mirror, a rear bumper, a back door, and an upper portion of a wind shield in the vehicle room. The imaging unit 12101 arranged at the front nose and the imaging unit 12105 arranged at the upper portion of the wind shield in the vehicle room mainly acquire images of a forward direction of a vehicle 12100. The imaging units 12102, 12103 arranged at the side mirrors mainly acquire images of a sideward direction of the vehicle 12100. The imaging unit 12104 arranged at the rear bumper or the backdoor mainly acquires images of a backward direction of the vehicle 12100. The imaging unit 12105 arranged at the upper portion of the wind shield in the vehicle room is mainly used to detect a vehicle driving ahead, a pedestrian, an obstacle, a traffic light, a traffic sign, a lane, and the like.

In FIG. 19, one example of an imaging range of the imaging units 12101 to 12104 is illustrated. An imaging range 12111 indicates an imaging range of the imaging unit 12101 arranged at the front nose, imaging ranges 12112, 12113 indicate imaging ranges of the imaging units 12102, 12103 respectively arranged at the side mirrors, and an imaging range 12114 indicates an imaging range of the imaging unit 12104 arranged at the rear bumper or the back door. For example, by overlapping image data acquired by the imaging units 12101 to 12104, an overhead view of the vehicle 12100 viewed from above can be obtained.

At least one of the imaging units 12101 to 12104 may have a function of acquiring distance information. For example, at least one of the imaging units 12101 to 12104 may be a stereo camera constituted of plural imaging devices, or may be an imaging device having a pixel for phase difference detection.

For example, the microcomputer 12051 can extract a three-dimensional object that is a closest three-dimensional object particularly present on a traveling road of the vehicle 12100, and that runs at a predetermined speed (for example, 0 km/h or higher) in a substantially the same direction as the vehicle 12100 as a vehicle running ahead by acquiring a distance to respective three-dimensional objects present within the imaging ranges 12111 to 12114 and a temporal change of this distance (relative speed with respect to the vehicle 12100) based on the distance information acquired from the imaging units 12101 to 12104. Furthermore, the microcomputer 12051 can perform automatic brake control (including stop control), an automatic acceleration control (including start control) and the like by setting a distance from a vehicle ahead to be maintained in front in advance. A coordinate control aimed at unattended operation to drive autonomously without an operation by a driver can thus be performed.

For example, the microcomputer 12051 can extract three-dimensional object data relating to a three-dimensional object, classifying into a bicycle, an ordinary vehicle, a large-size vehicle, a pedestrian, and other three-dimensional objects such as a utility pole, based on the distance information acquired from the imaging units 12101 to 12104, and can use it for automatic avoidance. For example, the microcomputer 12051 discriminates obstacles around the vehicle 12100 between an obstacle that can be visually recognized by the driver of the vehicle 12100 and an obstacle difficult be visually recognized. The microcomputer 12051 can determine a collision risk indicating the degree of risk of colliding with the respective objects, can output an alarm to the driver through the audio speaker 12061 or the display unit 12062 when it is in a situation having a collision possibility with the collision risk at a predetermined value or higher, or can perform driving support to avoid collision by forcible deceleration or steering for avoidance through the drive-system control unit 12010.

At least one of the imaging units 12101 to 12104 may be an infrared ray camera that detects an infrared ray. For example, the microcomputer 12051 can recognize a pedestrian by determining whether a pedestrian is present in captured images of the imaging units 12101 to 12104. Such a recognition of a pedestrian is performed by a procedure of extracting feature points in a captured image of the imaging units 12101 to 12104, for example, as an infrared camera, and a procedure of determining whether it is a pedestrian by performing pattern matching processing with respect to a series of feature points indicating an outline of an object. When the microcomputer 12051 determines that a pedestrian is present in the captured images of the imaging units 12101 to 12104, and recognizes a pedestrian, the sound-image output unit 12052 controls the display unit 12062 to superimpose a rectangular outline for highlighting the recognized pedestrian to be displayed. Moreover, the sound-image output unit 12052 may control the display unit 12062 to display an icon expressing a pedestrian or the like at a desirable position.

As above, one example of the vehicle control system to which the technique according to the present disclosure can be applied has been explained. The technique according to the present disclosure can be applied, for example, to the imaging unit 12031 out of the components described above. Specifically, the solid-state imaging device 11 of FIG. 3 can be applied to the imaging unit 12031. By applying the technique according to the present disclosure to the imaging unit 12031, a captured image having a high quality can be acquired and, therefore, can provide higher quality information to a driver.

<4. Conclusion>

As explained above, according to the embodiment of the present disclosure, by expanding a dynamic range of a comparator, a solid-state imaging device and an electronic device that is equipped with the solid-state imaging device that can support expansion of a dynamic range of a pixel, and can cope with decreased voltage of a pixel can be provided.

As above, exemplary embodiment of the present disclosure has been explained with reference to the accompanying drawings, but a technical scope of the present disclosure is not limited to the example. It is obvious that those who have common knowledge in a technical field of the present disclosure can think of various alteration examples and correction examples within a scope of the technical idea described in claims, and these are also understood to naturally belong to the technical scope of the present disclosure.

Moreover, the effects described in the present application are only an explanatory or exemplary, and are not limited. That is, the technique according to the present disclosure can produce other effects obvious to those skilled in the art from the description of the present application, in addition to the effect described above or in place of the effects described above.

Following configurations also belong to the technical scope of the present disclosure.

(1)

A solid-state imaging device comprising:
a pixel array that includes a plurality of pixels outputting a pixel signal by photoelectric conversion; and
an AD conversion processing unit that performs AD conversion with respect to the pixel signal, wherein
the AD conversion processing unit includes a comparator including
a first amplifying unit that includes a pair of first differential pairs constituted of P-type transistors and a pair of second differential pairs constituted of N-type transistors; and
a second amplifying unit that amplifies an output of the first amplifying unit, and in which a P-type transistor and an N-type transistor are connected in series.

(2)

The solid-state imaging device according to (1), wherein to the first differential pair and the second differential pair, any one of the pixel signal and a reference signal with which a voltage value decreases at a constant slope is selectively input.

(3)

The solid-state imaging device according to (2), wherein the first differential pair is constituted of a first transistor and a second transistor, and
when the pixel signal is input to a gate terminal of the first transistor, the reference signal is input to a gate terminal of the second transistor, and when the reference signal is input to the gate terminal of the first transistor, the pixel signal is input to the gate terminal of the second transistor.

(4)

The solid-state imaging device according to (2), wherein the second differential pair is constituted of a third transistor and a fourth transistor, and
when the pixel signal is input to a gate terminal of the third transistor, the reference signal is input to a gate terminal of the fourth transistor, and when the reference signal is input to the gate terminal of the third transistor, the pixel signal is input to the gate terminal of the fourth transistor.

(5)

The solid-state imaging device according to any one of (2) to (4), wherein
selective input to the first differential pair and the second differential pair is switched in a frame unit.

(6)

The solid-state imaging device according to (5), wherein the comparator is provided in each column of the pixel array, and
the selective input to the first differential pair and the second differential pair is identical in all of columns.

(7)

The solid-state imaging device according to (5), wherein the comparator is provided in each column of the pixel array, and
the selective input to the first differential pair and the second differential pair is reversed in an adjacent column.

(8)

The solid-state imaging device according to any one of (2) to (7), further comprising
a timing control unit that controls selective input to the first differential pair and the second differential pair.

(9)

The solid-state imaging device according to any one of (2) to (8), wherein
a wiring for input of the pixel signal, a wiring for input of the reference signal, and a wiring for output from the second amplifying unit are arranged in a line symmetry.

(10)

An electronic device comprising:
a solid-state imaging device; and
a processing unit that processes a signal output from the solid-state imaging device, wherein
the solid-state imaging device includes
a pixel array that includes a plurality of pixels outputting a pixel signal by photoelectric conversion; and
an AD conversion processing unit that performs AD conversion with respect to the pixel signal,
the AD conversion processing unit includes a comparator including
a first amplifying unit that includes a pair of first differential pairs constituted of P-type transistors and a pair of second differential pairs constituted of N-type transistors; and
a second amplifying unit that amplifies an output of the first amplifying unit, and in which a P-type transistor and an N-type transistor are connected in series.

REFERENCE SIGNS LIST

11 SOLID-STATE IMAGING DEVICE
12 PIXEL ARRAY UNIT
17 COLUMN PROCESSING UNIT
21 PIXEL
22 COLUMN SIGNAL LINE
23 VERTICAL SIGNAL LINE
30 AD CONVERTER CIRCUIT
31 COMPARATOR
33 SWITCH
41 PHOTODIODE
42 TRANSFER TRANSISTOR
43 CHARGE ACCUMULATION UNIT

44 FD UNIT
45 AMPLIFICATION TRANSISTOR
46 SELECTION TRANSISTOR
47 RESET TRANSISTOR
81 FIRST AMPLIFIER
82 SECOND AMPLIFIER

The invention claimed is:

1. A solid-state imaging device comprising:
  a pixel array that includes a plurality of pixels outputting a pixel signal by photoelectric conversion; and
  an AD conversion processing unit that performs AD conversion with respect to the pixel signal, wherein
  the AD conversion processing unit includes a comparator, and the comparator includes:
    a first amplifying unit that includes: a first differential pair constituted of P-type transistors; and a second differential pair constituted of N-type transistors; and
    a second amplifying unit that amplifies an output of the first amplifying unit, and in which a P-type transistor and an N-type transistor are connected in series.

2. The solid-state imaging device according to claim 1, wherein
  to the first differential pair and the second differential pair, one of the pixel signal or a reference signal with which a voltage value decreases at a constant slope is selectively input.

3. The solid-state imaging device according to claim 2, wherein
  the first differential pair is constituted of a first transistor and a second transistor,
  when the pixel signal is input to a gate terminal of the first transistor, the reference signal is input to a gate terminal of the second transistor, and when the reference signal is input to the gate terminal of the first transistor, the pixel signal is input to the gate terminal of the second transistor.

4. The solid-state imaging device according to claim 2, wherein
  the second differential pair is constituted of a third transistor and a fourth transistor,
  when the pixel signal is input to a gate terminal of the third transistor, the reference signal is input to a gate terminal of the fourth transistor, and when the reference signal is input to the gate terminal of the third transistor, the pixel signal is input to the gate terminal of the fourth transistor.

5. The solid-state imaging device according to claim 2, wherein
  selective input to the first differential pair and the second differential pair is switched in a frame unit.

6. The solid-state imaging device according to claim 5, wherein
  the comparator is provided in each column of the pixel array, and
  the selective input to the first differential pair and the second differential pair is identical in all columns.

7. The solid-state imaging device according to claim 5, wherein
  the comparator is provided in each column of the pixel array, and
  the selective input to the first differential pair and the second differential pair is reversed in an adjacent column.

8. The solid-state imaging device according to claim 2, further comprising
  a timing control unit that controls selective input to the first differential pair and the second differential pair.

9. The solid-state imaging device according to claim 2, further comprising:
  a first wiring for input of the pixel signal; a second wiring for input of the reference signal; and a third wiring for output from the second amplifying unit, wherein the first wiring, the second wiring, and the third wiring are arranged in a line symmetry.

10. An electronic device, comprising:
  a solid-state imaging device; and
  a processing unit that processes a signal output from the solid-state imaging device, wherein
  the solid-state imaging device includes:
  a pixel array that includes a plurality of pixels outputting a pixel signal by photoelectric conversion; and
  an AD conversion processing unit that performs AD conversion with respect to the pixel signal, wherein
  the AD conversion processing unit includes a comparator, and the comparator includes:
    a first amplifying unit that includes: a first differential pair constituted of P-type transistors; and a second differential pair constituted of N-type transistors; and
    a second amplifying unit that amplifies an output of the first amplifying unit, and in which a P-type transistor and an N-type transistor are connected in series.

* * * * *